United States Patent
Zang et al.

(10) Patent No.: US 11,538,836 B2
(45) Date of Patent: Dec. 27, 2022

(54) CELL DEEP TRENCH ISOLATION PYRAMID STRUCTURES FOR CMOS IMAGE SENSORS

(71) Applicant: OMNIVISION TECHNOLOGIES, INC., Santa Clara, CA (US)

(72) Inventors: Hui Zang, San Jose, CA (US); Gang Chen, San Jose, CA (US); Chao Niu, Santa Clara, CA (US); Zhiqiang Lin, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 359 days.

(21) Appl. No.: 16/993,018

(22) Filed: Aug. 13, 2020

(65) Prior Publication Data
US 2022/0052085 A1 Feb. 17, 2022

(51) Int. Cl.
*H01L 27/146* (2006.01)

(52) U.S. Cl.
CPC .... *H01L 27/14603* (2013.01); *H01L 27/1464* (2013.01); *H01L 27/14645* (2013.01); *H01L 27/14649* (2013.01); *H01L 27/14683* (2013.01); *H01L 27/1463* (2013.01)

(58) Field of Classification Search
CPC .......... H01L 27/14603; H01L 27/1464; H01L 27/14645; H01L 27/14649; H01L 27/14683; H01L 27/1463; H01L 27/14621; H01L 27/14627; H01L 27/1461; H01L 27/14643; H01L 27/14689; H01L 27/146; H01L 27/14605; H01L 27/14629; H01L 27/14614; H01L 27/14623; H01L 27/14601; H01L 27/1462; H01L 27/14625
See application file for complete search history.

(56) References Cited

U.S. PATENT DOCUMENTS

| | | | |
|---|---|---|---|
| 7,828,983 B2 | 11/2010 | Weber et al. | |
| 9,991,309 B1* | 6/2018 | Yang | H01L 27/1463 |
| 10,224,364 B2 | 3/2019 | Zhao et al. | |
| 10,319,768 B2 | 6/2019 | Li et al. | |
| 2016/0225922 A1* | 8/2016 | Akkaya | H01L 27/14685 |
| 2017/0179325 A1 | 6/2017 | Chung et al. | |
| 2018/0337211 A1* | 11/2018 | Su | H01L 27/14685 |
| 2019/0165026 A1* | 5/2019 | Kuo | H01L 27/1464 |
| 2020/0365636 A1* | 11/2020 | Chen | H01L 27/14629 |

* cited by examiner

*Primary Examiner* — Selim U Ahmed
(74) *Attorney, Agent, or Firm* — Perkins Coie LLP

(57) ABSTRACT

A pixel cell includes a photodiode disposed proximate to a front side of a semiconductor layer to generate image charge in response to incident light directed through a backside of the semiconductor layer. A cell deep trench isolation (CDTI) structure is disposed along an optical path of the incident light to the photodiode and proximate to the backside of the semiconductor layer. The CDTI structure includes a plurality of portions arranged in the semiconductor layer. Each of the plurality of portions extends a respective depth from the backside towards the front side of the semiconductor layer. The respective depth of each of the plurality of portions is different than a respective depth of a neighboring one of the plurality of portions. Each of the plurality of portions is laterally separated and spaced apart from said neighboring one of the plurality of portions in the semiconductor layer.

49 Claims, 11 Drawing Sheets

CELL DEEP TRENCH ISOLATION PYRAMID STRUCTURES FOR CMOS IMAGE SENSORS

BACKGROUND INFORMATION

Field of the Disclosure

This disclosure relates generally to image sensors, and in particular but not exclusively, relates to complementary metal oxide semiconductor (CMOS) image sensors with near infrared light sensitivity.

Background

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene.

Two fields of applications in which image quality and light sensitivity are particularly important are security and automotive applications. For these applications the image sensor chip must typically provide high quality images in the visible light spectrum as well as have improved sensitivity in the infrared (IR) and/or near infrared (NIR) portions of the light spectrum. For instance, IR or NIR sensors may be used to provide improved visibility and imaging in low light and foggy conditions as well as help detect warmer objects in cooler environments.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
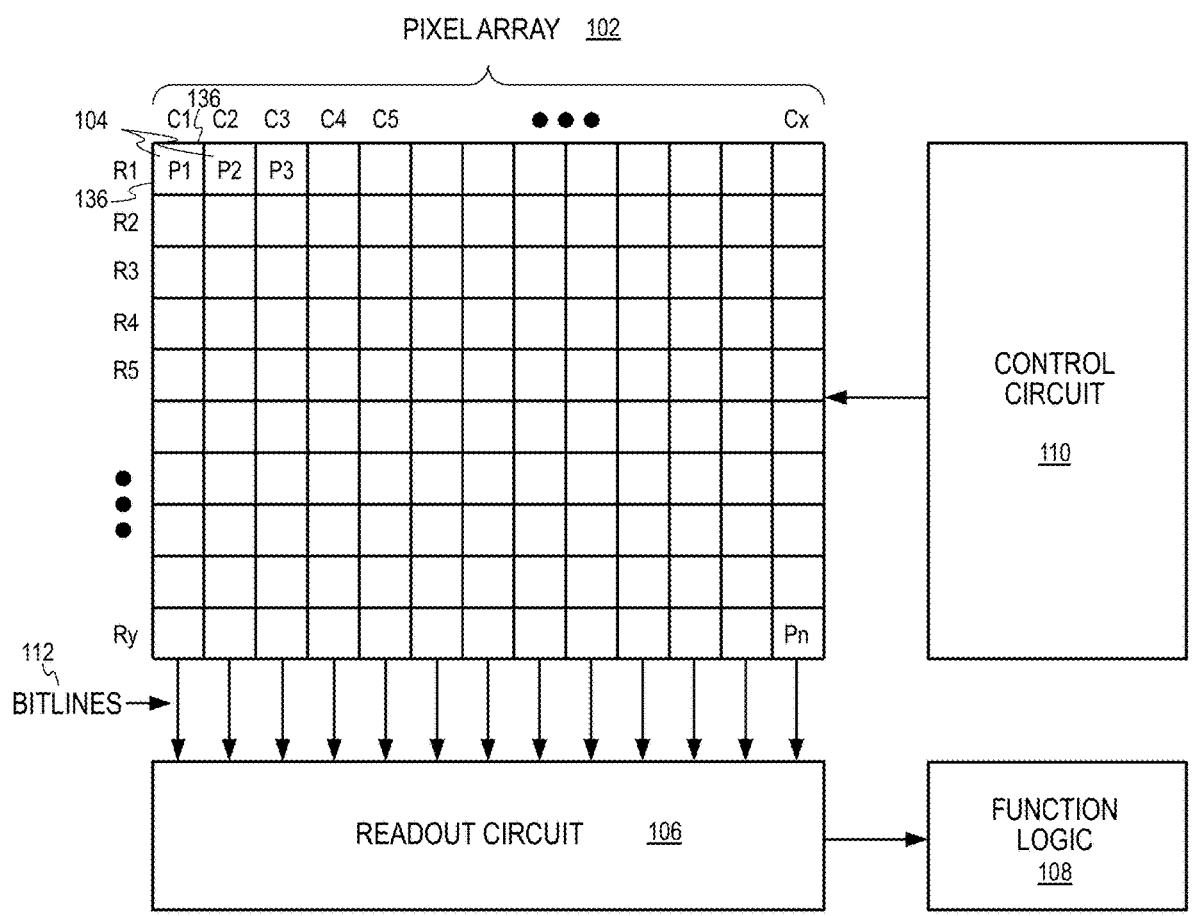
FIG. 1 illustrates one example of an imaging system including an array of pixel cells with cell deep trench isolation structures that help provide improved near infrared light sensitivity in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system with pixel cells including cell deep trench isolation structures that improve near infrared light sensitivity are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with an array of pixel cells including cell deep trench isolation (CDTI) structures are disclosed, which improve quantum efficiency (QE) performance, near infrared (NIR) light sensitivity, as well as reduce crosstalk. In various examples, the CDTI structures may be included in pixel cells adapted to detect NIR light, IR light, and/or the visible light spectrum as well as one or more of the neighboring pixel cells that are adapted to detect other colors of light such as red light, green light, blue light, etc. As will be shown, an example pixel cell includes a photodiode disposed in a pixel cell region of a semiconductor layer. The photodiode is proximate to a front side of the semiconductor layer and generates image charge in response to incident light that is directed through a backside of the semiconductor layer to the photodiode. A cell deep trench isolation (CDTI) structure is disposed in the pixel cell region of the semiconductor layer along an optical path of the incident light to the photodiode. The CDTI structure is proximate to the backside of the semiconductor layer. An example CDTI structure includes a plurality of portions arranged in the semiconductor layer. Each of the plurality of portions extends a respective depth from the backside towards the front side of the semiconductor layer. The respective depth of each of the plurality of portions is different than a respective depth of a neighboring one of the plurality of portions. Each of the plurality of portions is also laterally separated and spaced apart from the neighboring plurality of portions in the semiconductor layer.

To illustrate, FIG. 1 illustrates one example of a complementary metal oxide semiconductor (CMOS) imaging system 100 with an image sensor including a pixel array with an array of pixel cells that include cell deep trench isolation (CDTI) structures that improve quantum efficiency (QE) performance, near infrared (NIR) light sensitivity, as well as reduce crosstalk in accordance with the teachings of the present invention. As shown in the depicted example, the imaging system 100 includes an image sensor with pixel array 102, a control circuit 110, a readout circuit 106, and function logic 108. In one example, pixel array 102 is a two-dimensional (2D) array of pixel cells 104 that include one or more photodiodes. In one example, the pixel cells 104 (e.g., P1, P2, Pn) are arranged into rows (e.g., R1 to Ry) and columns (e.g., C1 to Cx) to acquire image data of a person, place, object, etc., which can then be used to render an image of a person, place, object, etc. In one example, the pixel cells 104 are separated from each other with a deep trench isolation (DTI) structure and/or an implant isolation structure 136 formed into a grid structure, which includes portions that are disposed between neighboring pixel cells 104 to provide isolation.

As will be described in greater detail below, various examples of the pixel array 102 include pixel cells 104 that are adapted to detect various colors of visible light as well as infrared (IR) and/or near infrared (NIR) light. In the various examples, CDTI structures are included in the pixel cells 104 that are adapted to detect NIR light. In some of the examples, the CDTI structures may also be included in at least some of the neighboring pixel cells 104 that are adapted to detect other colors of light (e.g., red light, green light, blue light, etc.).

After the photodiodes of pixel cells 104 have acquired their image charge, the corresponding analog image signals are read out by readout circuit 106 through column bitlines 112. In the various examples, readout circuit 106 includes an analog-to-digital conversion (ADC) circuit 114, which is coupled to convert the analog image signals received from the pixel cells 104 through bitlines 112 to digital image signals, which may be then transferred to function logic 108. Function logic 108 may simply store the image data or even manipulate the image data by applying post image processing or effects. Such image processing may, for example, include image processing, image filtering, image extraction and manipulation, determination of light intensity, crop, rotate, remove red eye, adjust brightness, adjust contrast, etc.

In one example, a control circuit 110 is coupled to pixel array 102 to control operational characteristics of pixel array 102. For instance, in one example, control circuit 110 generates the transfer gate signals and other control signals to control the transfer and readout of image data from all of the pixel cells 104 of pixel array 102. In addition, control circuit 110 may generate a shutter signal for controlling image acquisition. In one example, the shutter signal is a rolling shutter signal such that each row of the pixel array 102 is read out sequentially row by row during consecutive acquisition windows. The shutter signal may also establish an exposure time, which is the length of time that the shutter remains open. In one embodiment, the exposure time is set to be the same for each of the frames.

Figure 2A:
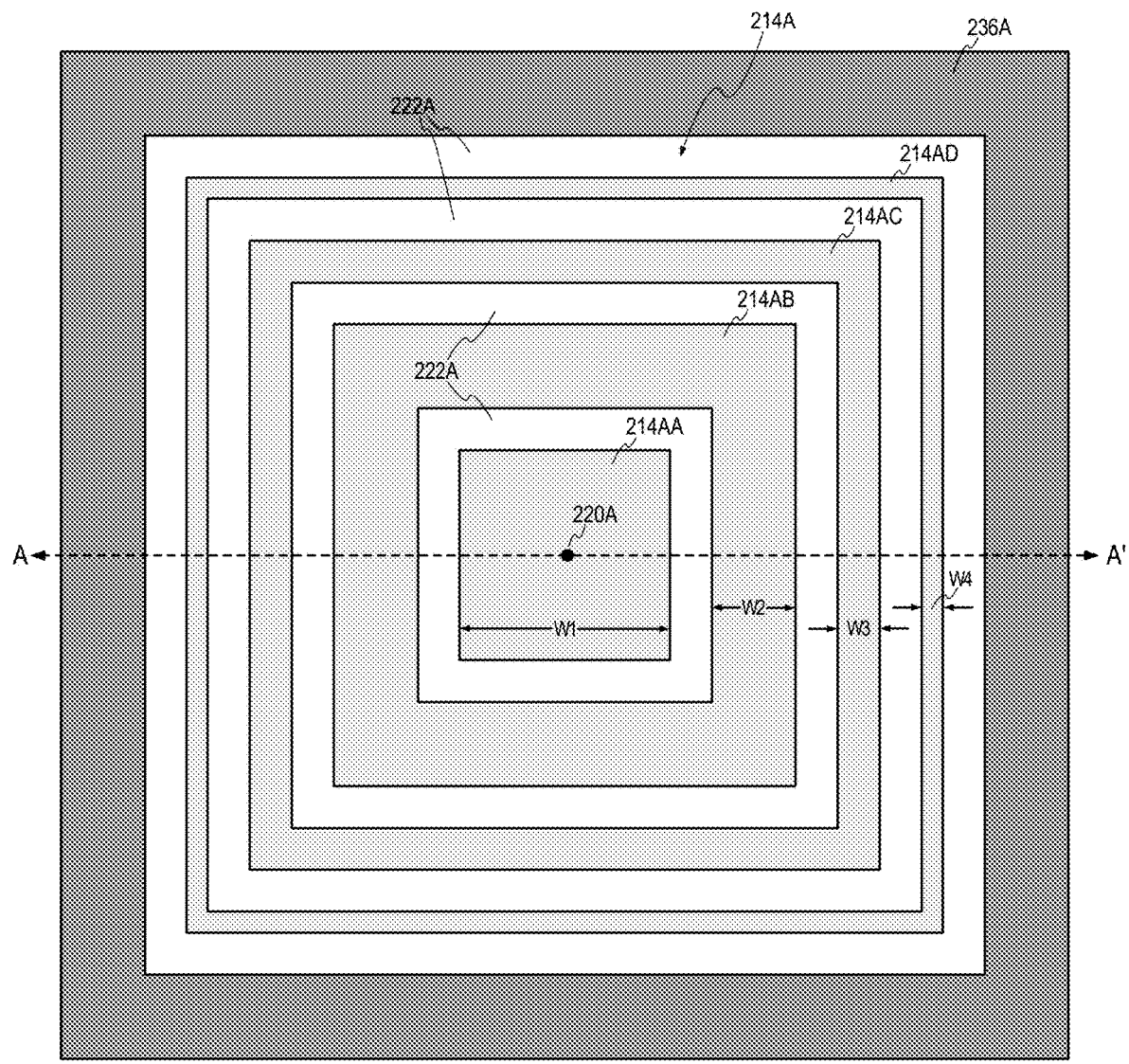
FIG. 2A shows a top view of a pixel cell illustrating an example of a cell deep trench isolation structure in accordance with the teachings of the present invention.

FIG. 2A is an example top view a pixel cell 204A illustrating one example of a CDTI structure 214A in accordance with the teachings of the present invention. It is noted that example pixel cell 204A of FIG. 2A may be an example of one or more of the pixel cells 104 of the example pixel array 102 of FIG. 1, and it should be appreciated that similarly named and numbered elements referenced below are coupled and function as described above. In the depicted example, pixel cell 204A is adapted to detect incident light including NIR light or IR light. In the example, pixel cell 204A includes a CDTI structure 214A disposed in a pixel cell 204A region of the semiconductor layer 222A. In one example, CDTI structure 214A is formed with a low k material, an oxide material, or other suitable dielectric material in the semiconductor layer 222A. In one example, the semiconductor layer 222A may include silicon or another suitable type of semiconductor material. In one embodiment, the semiconductor layer 222A may be an epitaxial layer grown on a semiconductor substrate or a semiconductor layer 222A wafer. In one embodiment, the semiconductor layer 222A may be formed of one or suitable types of semiconductor material, may undergo several process steps that form regions and/or junctions in the semiconductor layer 222A. As will be more apparent in another view below, example CDTI structure 214A is disposed proximate to a backside of the semiconductor layer 222A and along an optical path of incident light that is directed to a photodiode disposed proximate to a front side the semiconductor layer 222A along the optical path.

As shown in the top view of example of pixel cell 204A in FIG. 2A, CDTI structure 214A includes a plurality of portions, which are illustrated in the example as portions 214AA, 214AB, 214AC, 214AD. In the example, each of the plurality of portions 214AA, 214AB, 214AC, 214AD is laterally separated and spaced apart from a neighboring one of the plurality of portions 214AA, 214AB, 214AC, 214AD in the semiconductor layer 222A. In one example, each of the plurality of portions 214AA, 214AB, 214AC, 214AD is equally spaced from a neighboring one of the plurality of portions 214AA, 214AB, 214AC, 214AD in the semiconductor layer 222A. In one example, the spacing between each of the plurality of portions 214AA, 214AB, 214AC, 214AD and adjacent one of the plurality of portions 214AA, 214AB, 214AC, 214AD is different.

In the example depicted in FIG. 2A, it is noted that portion 214AA of CDTI structure 214A is a center portion, or at the center of CDTI structure 214A in the pixel cell 204A. As such, a longitudinal center line 220A of the CDTI structure 214A extends through center portion 214AA as shown. It is noted that the longitudinal center line 220A is a line that extends into or out from the page, and is therefore illustrated as a point in FIG. 2A. In the example shown in FIG. 2A, the plurality of portions 214AA, 214AB, 214AC, 214AD are arranged in a pattern of concentric shapes in the semiconductor layer 222A with portions 214AB-214AD arranged concentrically around center portion 214AA as shown.

In the depicted example, the example concentric shapes of the plurality of portions 214AA, 214AB, 214AC, 214AD are substantially square or rectangular in shape. As will be illustrated in other examples, it is appreciated that the example concentric shapes of the plurality of portions 214AA, 214AB, 214AC, 214AD may have other shapes such as substantially circular, rectangular, a plurality or an array of pillar structures, etc., that are arranged in the semiconductor layer 222A.

In the example shown in FIG. 2A, each of the plurality of portions 214AA, 214AB, 214AC, 214AD has a respective width. The example illustrates the respective widths as W1, W2, W3, W4. In the example, W1>W2>W3>W4. In other examples, it is appreciated that relative unequal relationships between W1, W2, W3, W4 may be different. As will be more apparent in another view below, each of the plurality of portions 214AA, 214AB, 214AC, 214AD also extends a respective depth from the backside towards the front side of the semiconductor layer 222A. The respective depth of each of the plurality of portions 214AA, 214AB, 214AC, 214AD is related to the respective width of the plurality of portions 214AA, 214AB, 214AC, 214AD. In the example, the respective depth of each of the plurality of portions 214AA, 214AB, 214AC, 214AD increases as the respective width of the plurality of portions 214AA, 214AB, 214AC, 214AD increases due to an etch loading effect during manufacture, such as for instance during a dry etching process (e.g., plasma etching) for forming associated trench structures. Thus, the respective depth of each of the plurality of portions 214AA, 214AB, 214AC, 214AD is different than a respective depth of a neighboring one of the plurality of portions 214AA, 214AB, 214AC, 214AD that has a different respective width (e.g., W1, W2, W3, W4).

In the illustrated example, it is noted that a nearest or closest neighboring portion of each portion 214AA, 214AB, 214AC, 214AD in a direction along a lateral line that passes through the longitudinal center line 220A has a different respective width. For instance, it is noted that dashed line A-A' illustrated in FIG. 2A is an example of a lateral line that passes through the longitudinal center line 220A. As such, a nearest neighboring portion of center portion 214AA along dashed line A-A' is portion 214AB. Similarly, nearest neighbors of portion 214AB include portion 214AA or portion 214AC along dashed line A-A'. Thus, the respective width W1 of portion 214AA is different than the respective width W2 of portion 214AB, which is different that the respective width W3 of portion 214AC, and so on. As will be shown in another view below, since the respective width W1 of center portion 214AA is greater than the respective width W2 of portion 214AB, the respective depth of center portion 214AA is greater than the respective depth of portion 214AB, and so on. Thus, there is a difference in the respective widths and a corresponding difference in the respective depths between neighboring portions 214AB, 214AC, 214AD along the dashed line A-A'.

In one example, the plurality of portions 214AA, 214AB, 214AC and 214AD of CDTI structure 214A may be arranged with a structural symmetry. For example, portions 214AB, 214AC and 214AD are arranged symmetrical with respect to the center portion 214AA. For example, portions 214AA, 214AB, 214AC and 214AD are arranged symmetrical with respect to the longitudinal center line 220A. The structural symmetry of CDTI structure 214A may also help to increase light absorption as the incident light directed to the respective photodiode is symmetric.

In the example shown in FIG. 2A, dashed line A-A' through the longitudinal center line 220A is illustrated as a "horizontal" line for explanation purposes. It is appreciated that dashed line A-A' could also have been illustrated as a "vertical" line, a "diagonal" line, etc., through longitudinal center line 220A.

In the example illustrated in FIG. 2A, it is noted that pixel cell 204A also includes another or a second deep trench isolation (DTI) structure 236A, which surrounds the pixel cell 204A region of the semiconductor layer 222A. In the example, the DTI structure 236A therefore isolates or separates the pixel cell 204A from neighboring pixel cells in the pixel array. For instance, referring back to the example illustrated in FIG. 1, the DTI structure 236A surrounding each of the pixel cells 204A as shown in FIG. 2A forms collectively a grid structure 136 that provides a boundary between each of the pixel cells 104 in the pixel array 102 in FIG. 1.

As will be shown in greater detail below, in one example, the DTI structure 236A extends a DTI structure depth from the backside towards the front side of the semiconductor layer 222A to isolate or separate each of the pixel cells 204A from neighboring pixel cells. In one example, the DTI structure 236A extends the DTI structure depth from the backside into the semiconductor layer 222A toward the front side of the semiconductor layer 222A to form a partial backside deep trench isolation structure such that the DTI structure depth of DTI structure 236A is greater than the depth of CDTI structure 214A and less than the thickness of the semiconductor layer 222A between the backside and the front side of the semiconductor layer 222A. In another embodiment, the DTI structure depth of DTI structure 236A is substantially equal to the thickness of the semiconductor layer 222A such that the DTI structure 236A extends between the backside and the front side of the semiconductor layer 222A. In various examples, the DTI structure 236A may be formed of a low k material, an oxide material, or other suitable dielectric material in the semiconductor layer 222A. The DTI structure 236A may be formed with the same or different material as the CDTI structure 214A.

Figure 2B:
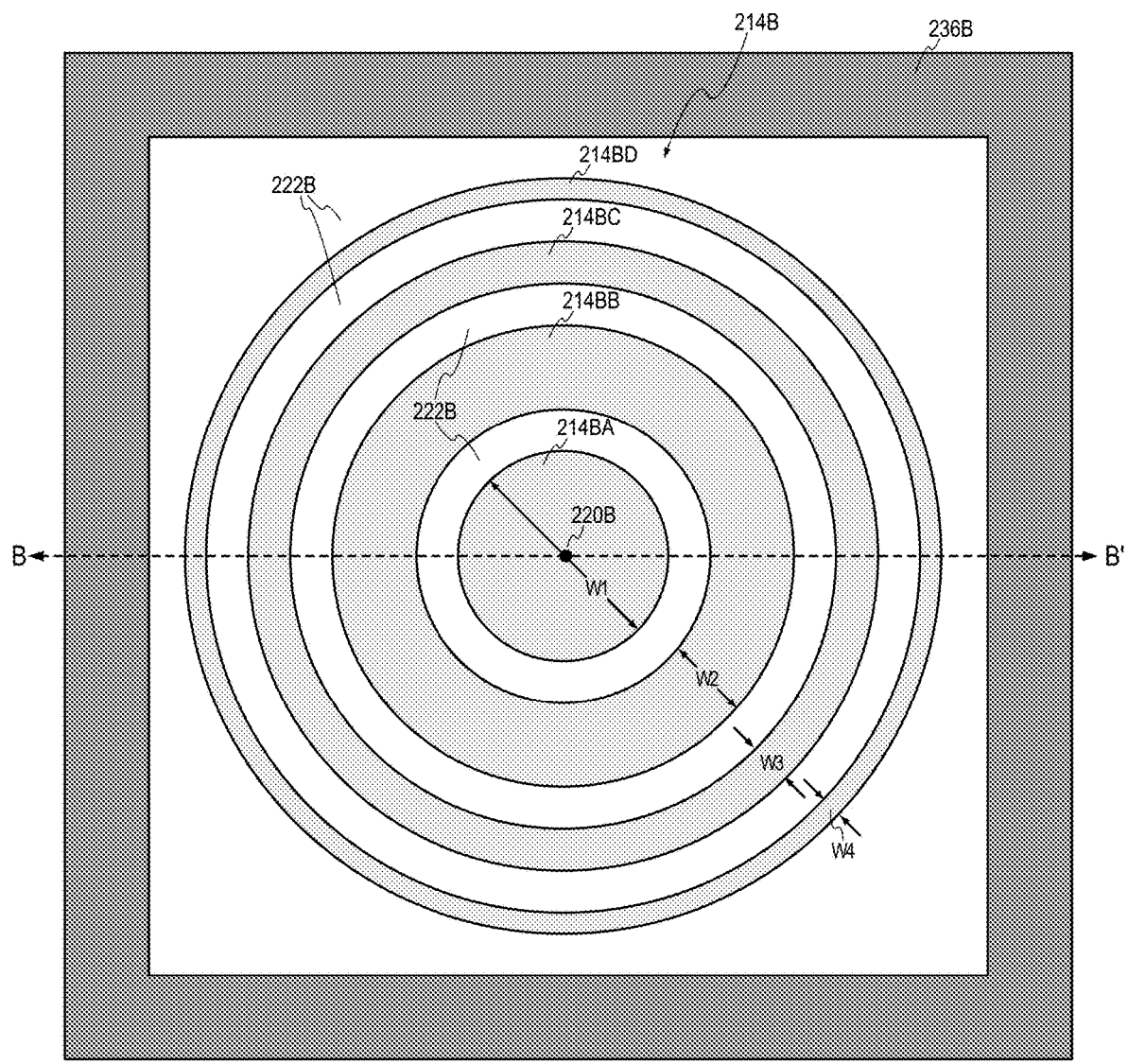
FIG. 2B shows a top view of a pixel cell illustrating another example of a cell deep trench isolation structure in accordance with the teachings of the present invention.

FIG. 2B is an example top view a pixel cell 204B illustrating another example of a CDTI structure 214B in accordance with the teachings of the present invention. It is noted that example pixel cell 204B of FIG. 2B may be also be an example of one or more of the pixel cells 104 of the example pixel array 102 of FIG. 1, and it should be appreciated that similarly named and numbered elements referenced below are coupled and function as described above. In addition, it is further appreciated that example pixel cell 204B of FIG. 2B shares many similarities with example pixel cell 204A of FIG. 2A.

For instance, as shown in the example depicted in FIG. 2B, pixel cell 204B includes a CDTI structure 214B disposed in a pixel cell 204B region of the semiconductor layer 222B. In one example, pixel cell 204B is adapted to detect incident light including NIR light or IR light. In the example, CDTI structure 214B is formed with a low k material, an oxide material, or other suitable dielectric material in the semiconductor layer 222B. In one example, the semiconductor layer 222B may include silicon or another suitable type of semiconductor material. As will be more apparent in another view below, example CDTI structure 214B is disposed proximate to a backside of the semiconductor layer 222B and along an optical path of incident light that is directed to a photodiode disposed proximate to a front side the semiconductor layer 222B along the optical path.

As shown in the top view of example of pixel cell 204B in FIG. 2B, CDTI structure 214B includes a plurality of portions, which are illustrated in the example as portions 214BA, 214BB, 214BC, 214BD. In the example, each of the plurality of portions 214BA, 214BB, 214BC, 214BD is laterally separated and spaced apart from a neighboring one of the plurality of portions 214BA, 214BB, 214BC, 214BD in the semiconductor layer 222B. The spacing between each of the plurality of portions 214BA, 214BB, 214BC, 214BD and a neighboring one of the plurality of portions 214BA, 214BB, 214BC, 214BD in the semiconductor layer 222B can be the same or different.

In the example depicted in FIG. 2B, it is noted that portion 214BA of CDTI structure 214B is a center portion, or at the center of CDTI structure 214B in the pixel cell 204B. As such, a longitudinal center line 220B of the CDTI structure 214B extends through center portion 214BA as shown. It is noted that the longitudinal center line 220B is a line that extends into or out from the page, and is therefore illustrated as a point in FIG. 2B. In the example shown in FIG. 2B, the plurality of portions 214BA, 214BB, 214BC, 214BD are arranged in a pattern of concentric shapes in the semiconductor layer 222B with portions 214BB-214BD arranged concentrically around center portion 214BA as shown.

In one example, the plurality of portions 214BA, 214BB, 214BC and 214BD of CDTI structure 214B may be arranged with a structural symmetry. For example, portions 214BB, 214BC and 214BD are arranged symmetrical with respect to the center portion 214BA. For example, portions 214BA, 214BB, 214BC and 214BD are arranged symmetrical with respect to the longitudinal center line 220B. The structural symmetry of CDTI structure 214B may also help to increase light absorption as the incident light directed to the respective photodiode is symmetric.

One difference between CDTI structure 214B of FIG. 2B and CDTI structure 214A of FIG. 2A is that in the example CDTI structure 214B of FIG. 2B, the example concentric shapes of the plurality of portions 214BA, 214BB, 214BC, 214BD are substantially circular or oval in shape. In other examples, it is appreciated that the example concentric shapes of the plurality of portions 214BA, 214BB, 214BC, 214BD may have other shapes such as substantially square, rectangular, or a plurality or an array of pillar structures, etc., that are arranged in the semiconductor layer 222B.

In the example shown in FIG. 2B, each of the plurality of portions 214BA, 214BB, 214BC, 214BD has a respective width. The example illustrates the respective widths (diameters) as W1, W2, W3, W4. In the example, W1>W2>W3>W4. In other examples, it is appreciated that relative unequal relationships between W1, W2, W3, W4 may be different. As will be more apparent in another view below, each of the plurality of portions 214BA, 214BB, 214BC, 214BD also extends a respective depth from the backside towards the front side of the semiconductor layer 222B. In the example, the respective depth of each of the plurality of portions 214BA, 214BB, 214BC, 214BD increases as the respective width of the plurality of portions 214BA, 214BB, 214BC, 214BD increases due to the etch loading effect during manufacture, e.g., during a dry (plasma) etching process. Thus, the respective depth of each of the plurality of portions 214BA, 214BB, 214BC, 214BD is different than a respective depth of a neighboring one of the plurality of portions 214BA, 214BB, 214BC, 214BD that has a different respective width (e.g., W1, W2, W3, W4).

In the illustrated example, it is noted that a nearest or closest neighboring portion of each portion 214BA, 214BB, 214BC, 214BD in a direction along a lateral line that passes through the longitudinal center line 220B has a different respective width. For instance, it is noted that dashed line B-B' illustrated in FIG. 2B is an example of a lateral line that passes through the longitudinal center line 220B. As such, a nearest neighboring portion of center portion 214BA along dashed line B-B' is portion 214BB. Similarly, nearest neighbors of portion 214BB include portion 214BA or portion 214BC along dashed line B-B'. Thus, the respective width W1 of portion 214BA is different than the respective width W2 of portion 214BB, which is different that the respective width W3 of portion 214BC, and so on. As will be shown in another view below, since the respective width W1 of center portion 214BA is greater than the respective width W2 of portion 214BB, the respective depth of center portion 214BA is greater than the respective depth of portion 214BB, and so on. Thus, there is a difference in the respective widths and a corresponding difference in the respective depths between neighboring portions 214BA, 214BB, 214BC, 214BD along the dashed line B-B'.

In the example shown in FIG. 2B, dashed line B-B' through the longitudinal center line 220B is illustrated as a "horizontal" line for explanation purposes. It is appreciated that dashed line B-B' could also have been illustrated as a "vertical" line, a "diagonal" line, etc., through longitudinal center line 220B.

In the example illustrated in FIG. 2B, it is noted that pixel cell 204B also includes another or a second deep trench isolation (DTI) structure 236B, which surrounds the pixel cell 204B region of the semiconductor layer 222B. In the example, the DTI structure 236B therefore isolates or separates the pixel cell 204B from neighboring pixel cells in the pixel array. For instance, referring back to the example illustrated in FIG. 1, the DTI structure 236B surrounding each of the pixel cells 204B as shown in FIG. 2B forms collectively a grid structure 136 that provides a boundary between each of the pixel cells 104 in the pixel array 102 in FIG. 1.

As will be shown in greater detail below, in one example, the DTI structure 236B extends a DTI structure depth from the backside towards the front side of the semiconductor layer 222B to isolate or separate each of the pixel cells 204B from neighboring pixel cells. In one example, the DTI structure 236B extends the DTI structure depth from the backside into the semiconductor layer 222B toward the front side of the semiconductor layer 222B to form a partial backside deep trench isolation structure such that the DTI structure depth of DTI structure 236B is greater than the depth of CDTI structure 214B and less than the thickness of the semiconductor layer 222B between the backside and the front side. In another embodiment, the DTI structure depth of DTI structure 236B is substantially equal to the thickness of the semiconductor layer 222B such that the DTI structure 236B extends between the backside and the front side of the semiconductor layer 222B. In various examples, the DTI structure 236B may be formed of a low k material, an oxide material, or other suitable dielectric material in the semiconductor layer 222B. The DTI structure 236B may be formed with the same or different material as the CDTI structure 214B.

Figure 2C:
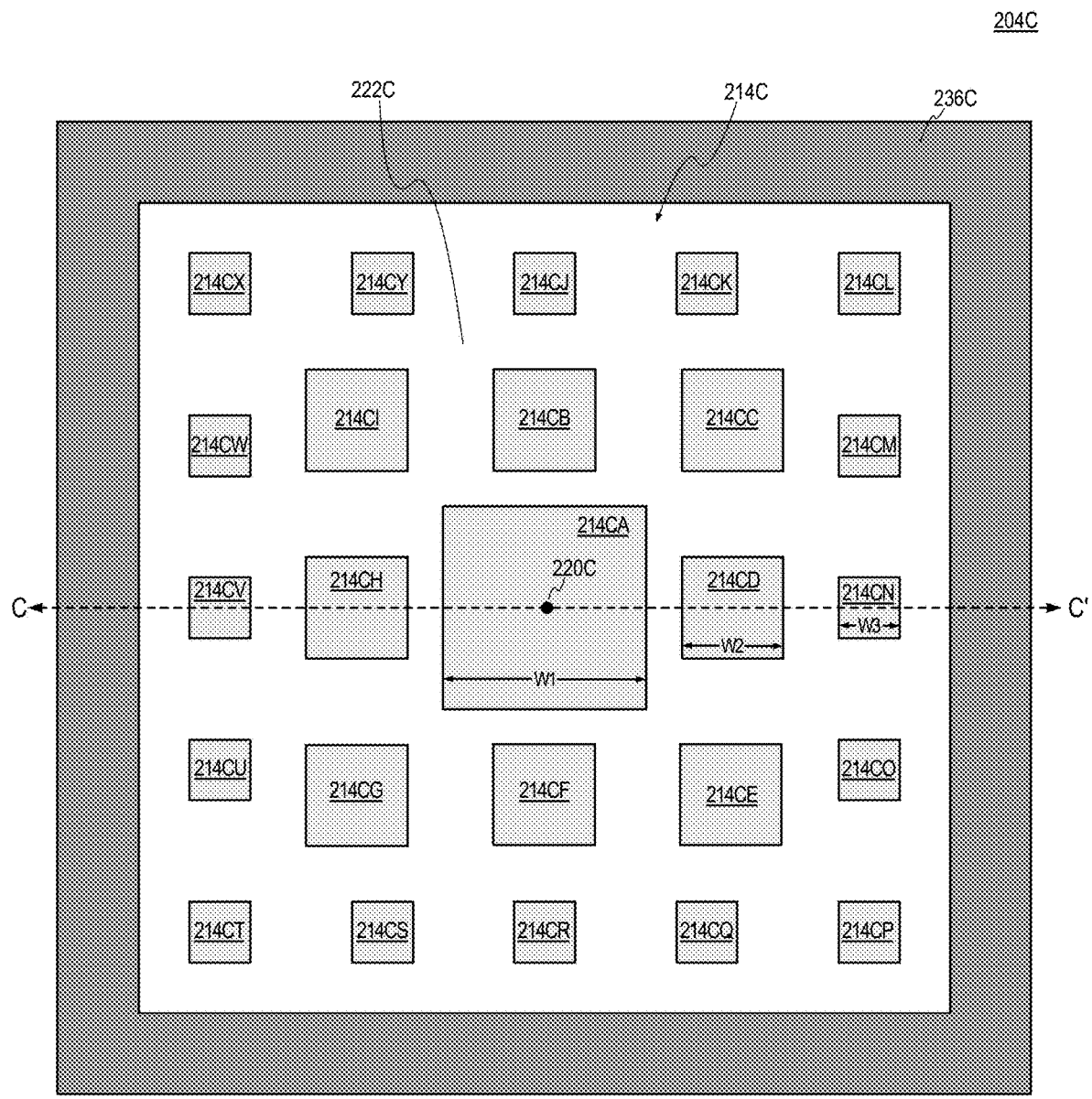
FIG. 2C shows a top view of a pixel cell illustrating yet another example of a cell deep trench isolation structure in accordance with the teachings of the present invention.

FIG. 2C is an example top view a pixel cell 204C illustrating yet another example of a CDTI structure 214C in accordance with the teachings of the present invention. It is noted that example pixel cell 204C of FIG. 2C may be also be an example of one or more of the pixel cells 104 of the example pixel array 102 of FIG. 1, and it should be appreciated that similarly named and numbered elements referenced below are coupled and function as described above. In addition, it is further appreciated that example pixel cell 204C of FIG. 2C shares many similarities with example pixel cell 204A of FIG. 2A and pixel cell 204B of FIG. 2B.

For instance, as shown in the example depicted in FIG. 2C, pixel cell 204C includes a CDTI structure 214C disposed in a pixel cell 204C region of the semiconductor layer 222C. In one example, pixel cell 204C is adapted to detect incident light including NIR light or IR light. In the example, CDTI structure 214C is formed with a low k material, an oxide material, or other suitable dielectric material in the semiconductor layer 222C. In one example, the semiconductor layer 222C may include silicon or another suitable type of semiconductor material. As will be more apparent in another view below, example CDTI structure 214C is disposed proximate to a backside of the semiconductor layer 222C and along an optical path of incident light that is directed to a photodiode disposed proximate to a front side the semiconductor layer 222C along the optical path.

As shown in the top view of example of pixel cell 204C in FIG. 2C, CDTI structure 214C includes a plurality of portions, which are illustrated in the example as portions 214CA, 214CB, 214CC, 214CD, 214CE, 214CF, 214CG, 214CH, 214CI, 214CJ, 214CK, 214CL, 214CM, 214CN, 214CO, 214CP, 214CQ, 214CR, 214CS, 214CT, 214CU, 214CV, 214CW, 214CX, 214CY. In the example, each of the plurality of portions 214CA-214CY is laterally separated and spaced apart from a neighboring one of the plurality of portions 214CA-214CY in the semiconductor layer 222C. The spacing between each of the plurality of portions 214CA-214CY and a neighboring one of the plurality of portions 214CA-214CY in the semiconductor layer 222C can be configured to be the same or different.

In the example depicted in FIG. 2C, it is noted that portion 214CA of CDTI structure 214C is a center portion, or at the center of CDTI structure 214C in the pixel cell 204C. As such, a longitudinal center line 220C of the CDTI structure 214C extends through center portion 214CA as shown. It is noted that the longitudinal center line 220C is a line that extends into or out from the page, and is therefore illustrated as a point in FIG. 2C. In the example shown in FIG. 2C, the plurality of portions 214CA-214CY are arranged in a pattern of concentric shapes in the semiconductor layer 222C with portions 214CB-214CI arranged concentrically around center portion 214CA, and portions 214CJ-214CY arranged concentrically around portions 214CB-214CI as shown.

One difference between CDTI structure 214CB of FIG. 2C and CDTI structure 214A of FIG. 2A and CDTI structure 214B of FIG. 2B is that in the example CDTI structure 214C of FIG. 2C, the example concentric shapes of the plurality of portions 214CA-214CY are provided with a plurality or an array of pillar structures arranged in semiconductor layer 222C. As shown in the example of FIG. 2C, the pillar-shaped portions 214CB-214CI are arranged as a plurality of portions that collectively form a concentric ring around center portion 214CA. Similarly, the pillar-shaped portions 214CJ-214CY are arranged as a plurality of portions that form a concentric ring around center portion 214CA and portions 214CB-214CI as shown.

In the example shown in FIG. 2C, the portions 214CA, 214CB-214CI, and 214CJ-214CY have respective widths. The example illustrates the respective widths as W1, W2, W3. In the example, W1>W2>W3. In other examples, it is appreciated that relative unequal relationships between W1, W2, W3 may be different. As will be more apparent in another view below, the portions 214CA, 214CB-214CI, and 214CJ-214CY also extend respective depths from the backside towards the front side of the semiconductor layer 222C. In the example, the respective depths of the portions 214CA, 214CB-214CI, and 214CJ-214CY increase as the respective widths of the portions 214CA, 214CB-214CI, and 214CJ-214CY increases due to the etch loading effect during manufacture, e.g., during an etching process, such as plasma etching for forming trench structures associated with portions 214CA, 214CB-214CI, and 214CJ-214CY. Thus, the respective depths of each of the portions 214CA, 214CB-214CI, and 214CJ-214CY is different than a respective depth of a neighboring one of the portions 214CA, 214CB-214CI, and 214CJ-214CY that has a different respective width (e.g., W1, W2, W3).

In the illustrated example, it is noted that a nearest or closest neighboring portion of the portions 214CA, 214CB-214CI, and 214CJ-214CY in a direction along a lateral line that passes through the longitudinal center line 220C has a different respective width. For instance, it is noted that dashed line C-C' illustrated in FIG. 2C is an example of a lateral line that passes through the longitudinal center line 220C. As such, a nearest neighboring portion of center portion 214CA along dashed line C-C' among the portions 214CA, 214CB-214CI, and 214CJ-214CY is included in portions 214CB-214CI. Similarly, nearest neighbors of portions 214CB-214CI include portion 214CA or one of the portions 214CJ-214CY along dashed line C-C'. Thus, the respective width W1 of portion 214CA is different than the respective width W2 of portions 214CB-214CI, which is different that the respective width W3 of 214CJ-214CY. As will be shown in another view below, since the respective width W1 of center portion 214CA is greater than the respective width W2 of portions 214CB-214CI, the respective depth of center portion 214CA is greater than the respective depth of portions 214CB-214CI, and so on. Thus, there is a difference in the respective widths and a corresponding difference in the respective depths between neighboring portions 214CA, 214CB-214CI, and 214CJ-214CY along the dashed line C-C'.

In one example, the plurality of portions 214CA, 214CB-214CI, and 214CJ-214CY of CDTI structure 214C may be arranged with a structural symmetry. For example, portions 214CB-214CI, and 214CJ-214CY are arranged symmetrical with respect to the center portion 214CA. For example, portions 214CA, 214CB-214CI, and 214CJ-214CY are arranged symmetrical with respect to the longitudinal center line 220C. The structural symmetry of CDTI structure 214C may also help to increase light absorption as the incident light directed to the respective photodiode is symmetric.

In the example shown in FIG. 2C, dashed line C-C' through the longitudinal center line 220C is illustrated as a "horizontal" line for explanation purposes. It is appreciated that dashed line C-C' could also have been illustrated as a "vertical" line, a "diagonal" line, etc., through longitudinal center line 220C.

In the example illustrated in FIG. 2C, it is noted that pixel cell 204C also includes another or a second deep trench isolation (DTI) structure 236C, which surrounds the pixel cell 204C region of the semiconductor layer 222C. In the example, the DTI structure 236C therefore isolates or separates the pixel cell 204C from neighboring pixel cells in the pixel array. For instance, referring back to the example illustrated in FIG. 1, the DTI structure 236C surrounding each of the pixel cells 204C as shown in FIG. 2C forms collectively a grid structure 136 that provides a boundary between each of the pixel cells 104 in the pixel array 102 in FIG. 1.

As will be shown in greater detail below, in one example, the DTI structure 236C extends a DTI structure depth from the backside towards the front side of the semiconductor layer 222C to isolate or separate each of the pixel cells 204C from neighboring pixel cells. In one example, the DTI structure 236C extends the DTI structure depth from the backside into the semiconductor layer 222C toward the front side of the semiconductor layer 222C to form a partial backside deep trench isolation structure such that the DTI structure depth of DTI structure 236C is greater than the depth of CDTI structure 214C and less than the thickness of the semiconductor layer 222C between the backside and the front side. In another embodiment, the DTI structure depth of DTI structure 236C is substantially equal to the thickness of the semiconductor layer 222C such that the DTI structure 236C extends between the backside and the front side of the semiconductor layer 222C. In various examples, the DTI structure 236C may be formed of a low k material, an oxide material, or other suitable dielectric material in the semiconductor layer 222C. The DTI structure 236C may be formed with the same or different material as the CDTI structure 214C.

Figure 2D:
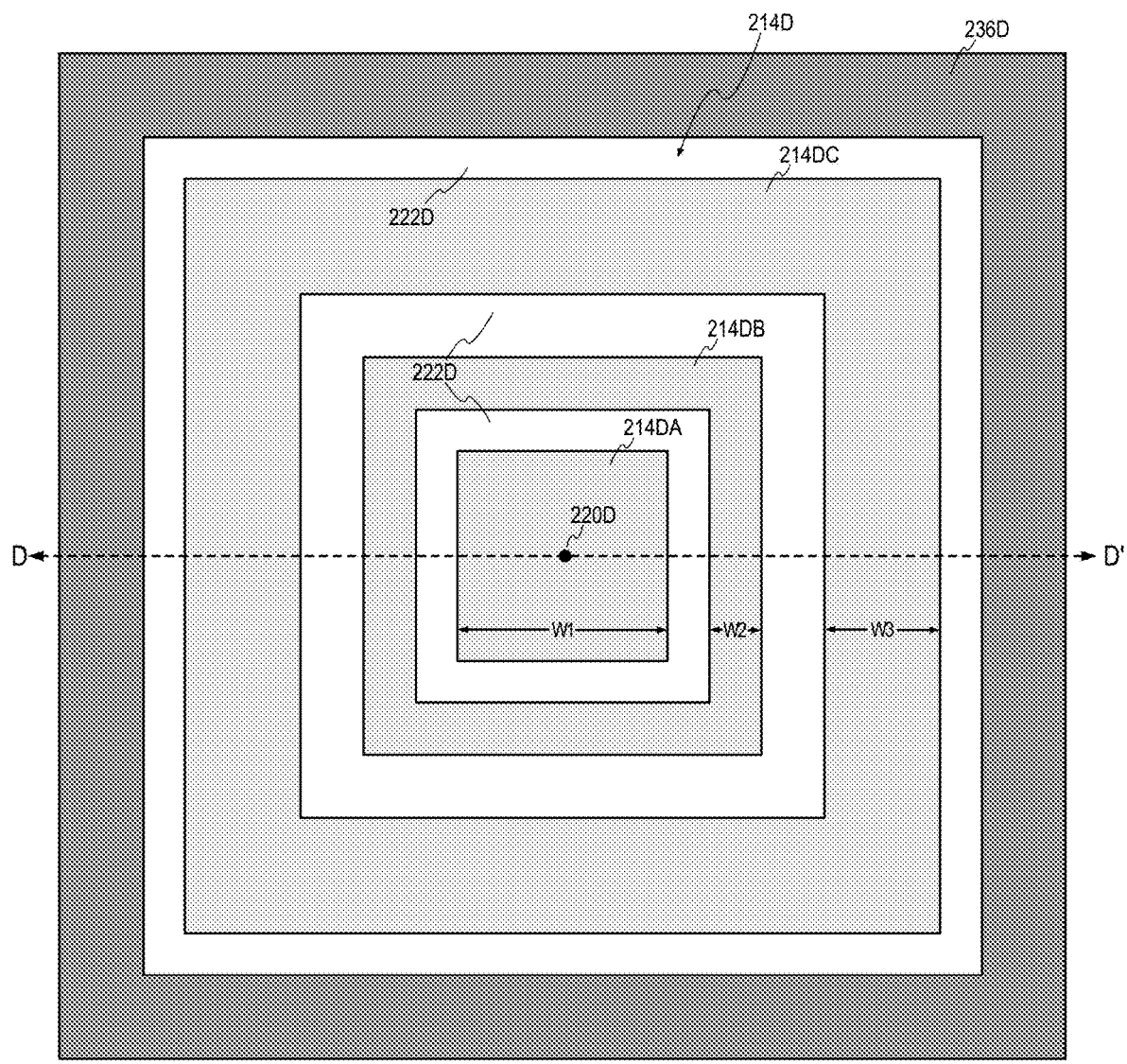
FIG. 2D shows a top view of a pixel cell illustrating still another example of a cell deep trench isolation structure in accordance with the teachings of the present invention.

FIG. 2D is an example top view a pixel cell 204D illustrating still another example of a CDTI structure 214D in accordance with the teachings of the present invention. It is noted that example pixel cell 204D of FIG. 2D may be also be an example of one or more of the pixel cells 104 of the example pixel array 102 of FIG. 1, and it should be appreciated that similarly named and numbered elements referenced below are coupled and function as described above. In addition, it is further appreciated that example pixel cell 204D of FIG. 2D shares many similarities with example pixel cell 204A of FIG. 2A.

For instance, as shown in the example depicted in FIG. 2D, pixel cell 204D includes a CDTI structure 214D disposed in a pixel cell 204D region of the semiconductor layer 222D. In one example, pixel cell 204D is adapted to detect incident light including NIR light or IR light. In the example, CDTI structure 214D is formed with a low k material, an oxide material, or other suitable dielectric material in the semiconductor layer 222D. In one example, the semiconductor layer 222D may include silicon or another suitable type of semiconductor material. As will be more apparent in another view below, example CDTI structure 214D is disposed proximate to a backside of the semiconductor layer 222D and along an optical path of incident light that is directed to a photodiode disposed proximate to a front side the semiconductor layer 222D along the optical path.

As shown in the top view of example of pixel cell 204D in FIG. 2D, CDTI structure 214D includes a plurality of portions, which are illustrated in the example as portions 214DA, 214DB, 214DC. In the example, each of the plurality of portions 214DA, 214DB, 214DC is laterally separated and spaced apart from a neighboring one of the plurality of portions 214DA, 214DB, 214DC in the semiconductor layer 222D.

In the example depicted in FIG. 2D, it is noted that portion 214DA of CDTI structure 214D is a center portion, or at the center of CDTI structure 214D in the pixel cell 204D. As such, a longitudinal center line 220D of the CDTI structure 214D extends through center portion 214DA as shown. It is noted that the longitudinal center line 220D is a line that extends into or out from the page, and is therefore illustrated as a point in FIG. 2D. In the example shown in FIG. 2D, the plurality of portions 214DA, 214DB, 214DC are arranged in a pattern of concentric shapes in the semiconductor layer 222D with portions 214DB, 214DC arranged concentrically around center portion 214DA as shown. In the depicted example, the concentric shapes of the plurality of portions 214DA, 214DB, 214DC are substantially square or rectangular in shape. In other examples, it is appreciated that the example concentric shapes of the plurality of portions 214DA, 214DB, 214DC may have other shapes such as substantially circular, oval, or a plurality or an array of pillar structures, etc., that are arranged in the semiconductor layer 222D.

In the example shown in FIG. 2D, each of the plurality of portions 214DA, 214DB, 214DC has a respective width. The example illustrates the respective widths as W1, W2, W3. One difference between CDTI structure 214D of FIG. 2D and CDTI structure 214A of FIG. 2A is that in the example CDTI structure 214D of FIG. 2D, the unequal relative relationships of the respective widths are W1>W2 and W3>W2. In other examples, it is appreciated that relative unequal relationships between W1, W2, W3 may be different. As will be more apparent in another view below, each of the plurality of portions 214DA, 214DB, 214DC also extends a respective depth from the backside towards the front side of the semiconductor layer 222D. In the example, the respective depth of each of the plurality of portions 214DA, 214DB, 214DC increases as the respective width of the plurality of portions 214DA, 214DB, 214DC increases due to the etch loading effect during manufacture. Thus, the respective depth of each of the plurality of portions 214DA, 214DB, 214DC is different than a respective depth of a neighboring one of the plurality of portions 214DA, 214DB, 214DC that has a different respective width (e.g., W1, W2, W3).

In the illustrated example, it is noted that a nearest or closest neighboring portion of each portion 214DA, 214DB, 214DC in a direction along a lateral line that passes through the longitudinal center line 220D has a different respective width. For instance, it is noted that dashed line D-D' illustrated in FIG. 2D is an example of a lateral line that passes through the longitudinal center line 220D. As such, a nearest neighboring portion of center portion 214DA along dashed line D-D' is portion 214DB. Similarly, nearest neighbors of portion 214DB include portion 214DA or portion 214DC along dashed line D-D'. Thus, the respective width W1 of portion 214DA is different than the respective width W2 of portion 214DB, which is different that the respective width W3 of portion 214DC. As will be shown in another view below, since the respective width W1 of center portion 214DA is greater than the respective width W2 of portion 214DB, the respective depth of center portion 214DA is greater than the respective depth of portion 214DB, and so on. Thus, there is a difference in the respective widths and a corresponding difference in the respective depths between neighboring portions 214DA, 214DB, 214DC along the dashed line D-D'.

In one example, the plurality of portions 214DA, 214DB, and 214DC of CDTI structure 214D may be arranged with a structural symmetry. For example, portions 214DB and 214DC are arranged symmetrical with respect to the center portion 214DA. For example, portions 214DA, 214DB, and 214DC are arranged symmetrical with respect to the longitudinal center line 220D. The structural symmetry of CDTI structure 214D may also help to increase light absorption as the incident light directed to the respective photodiode is symmetric.

In the example shown in FIG. 2D, dashed line D-D' through the longitudinal center line 220D is illustrated as a "horizontal" line for explanation purposes. It is appreciated that dashed line D-D' could also have been illustrated as a "vertical" line, a "diagonal" line, etc., through longitudinal center line 220D.

In the example illustrated in FIG. 2D, it is noted that pixel cell 204D also includes another or a second deep trench isolation (DTI) structure 236D, which surrounds the pixel cell 204D region of the semiconductor layer 222D. In the example, the DTI structure 236D therefore isolates or separates the pixel cell 204D from neighboring pixel cells in the pixel array. For instance, referring back to the example illustrated in FIG. 1, the DTI structure 236D surrounding each of the pixel cells 204D as shown in FIG. 2D forms collectively a grid structure 136 that provides a boundary between each of the pixel cells 104 in the pixel array 102 in FIG. 1.

As will be shown in greater detail below, in one example, the DTI structure 236D extends a DTI structure depth from the backside towards the front side of the semiconductor layer 222D to isolate or separate each of the pixel cells 204D from neighboring pixel cells. In one example, the DTI structure 236D extends the DTI structure depth from the backside into the semiconductor layer 222D toward the front side of the semiconductor layer 222D to form a partial backside deep trench isolation structure such that the DTI structure depth of DTI structure 236D is greater than the depth of CDTI structure 214D and less than the thickness of the semiconductor layer 222D between the backside and the front side. In another embodiment, the DTI structure depth of DTI structure 236D is substantially equal to the thickness of the semiconductor layer 222D such that the DTI structure 236D extends between the backside and the front side of the semiconductor layer 222D. In various examples, the DTI structure 236D may be formed of a low k material, an oxide material, or other suitable dielectric material in the semiconductor layer 222D. The DTI structure 236D may be formed with the same or different material as the CDTI structure 214D.

Figure 2E:
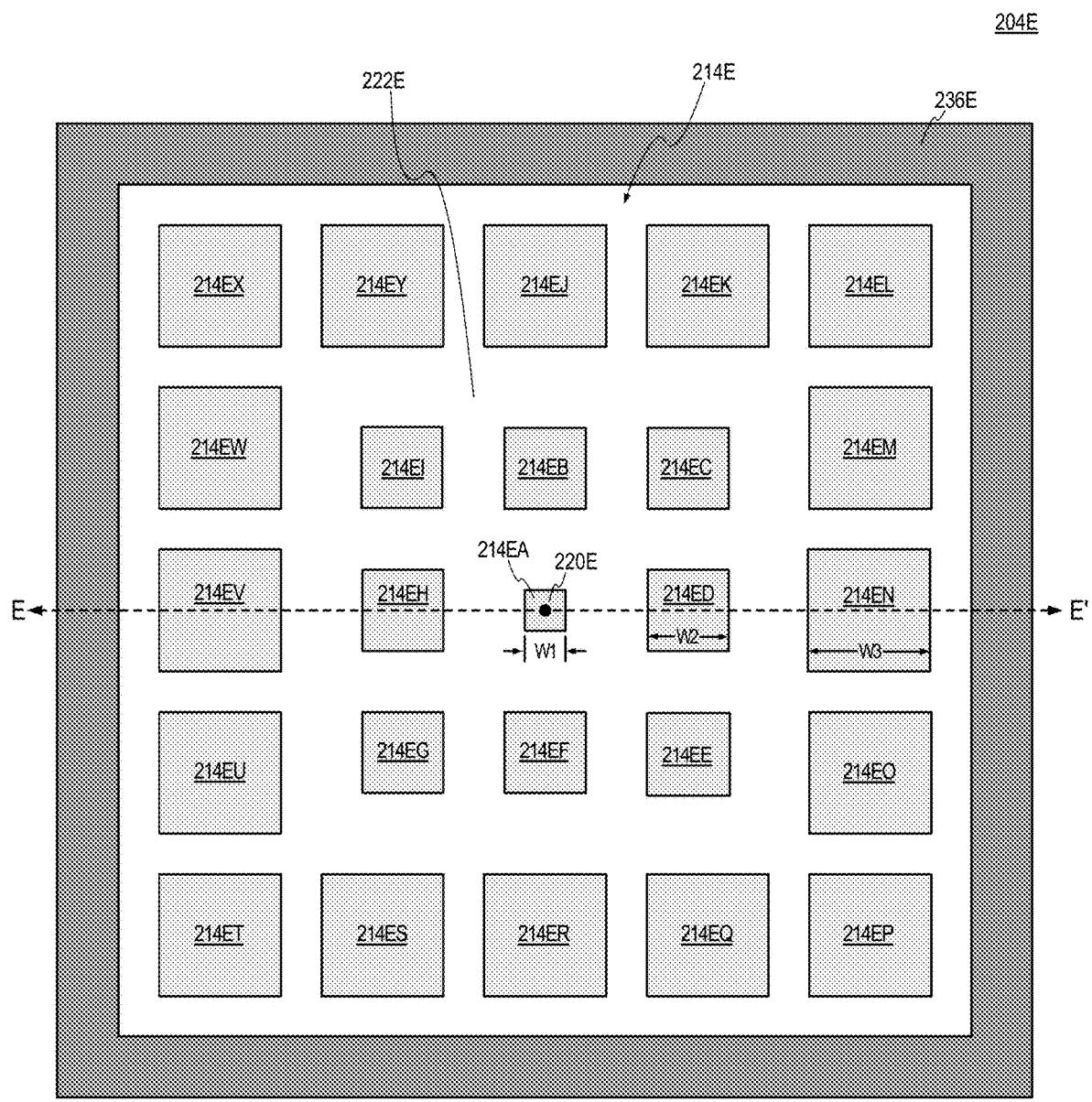
FIG. 2E shows a top view of a pixel cell illustrating yet another example of a cell deep trench isolation structure in accordance with the teachings of the present invention.

FIG. 2E is an example top view a pixel cell 204E illustrating yet another example of a CDTI structure 214E in accordance with the teachings of the present invention. It is noted that example pixel cell 204E of FIG. 2E may be also be an example of one or more of the pixel cells 104 of the example pixel array 102 of FIG. 1, and it should be appreciated that similarly named and numbered elements referenced below are coupled and function as described above. In addition, it is further appreciated that example pixel cell 204E of FIG. 2E shares many similarities with example pixel cell 204C of FIG. 2C.

For instance, as shown in the example depicted in FIG. 2E, pixel cell 204E includes a CDTI structure 214E disposed in a pixel cell 204E region of the semiconductor layer 222E. In one example, pixel cell 204E is adapted to detect incident light including NIR light or IR light. In the example, CDTI structure 214E is formed with a low k material, an oxide material, or other suitable dielectric material in the semiconductor layer 222E. In one example, the semiconductor layer 222E may include silicon or another suitable type of semiconductor material. As will be more apparent in another view below, example CDTI structure 214E is disposed proximate to a backside of the semiconductor layer 222E and along an optical path of incident light that is directed to a photodiode disposed proximate to a front side the semiconductor layer 222E along the optical path.

As shown in the top view of example of pixel cell 204E in FIG. 2E, CDTI structure 214E includes a plurality of portions, which are illustrated in the example as portions 214EA, 214EB, 214EC, 214ED, 214EE, 214EF, 214EG, 214EH, 214EI, 214EJ, 214EK, 214EL, 214EM, 214EN, 214EO, 214EP, 214EQ, 214ER, 214ES, 214ET, 214EU, 214EV, 214EW, 214EX, 214EY. In the example, each of the plurality of portions 214EA-214EY is laterally separated and spaced apart from a neighboring one of the plurality of portions 214EA-214EY in the semiconductor layer 222E. The spacing between each of the plurality of portions 214EA-214EY and a neighboring one of the plurality of portions 214EA-214EY in the semiconductor layer 222E can be the same or different depending on the configuration of CDTI structure 214D.

In the example depicted in FIG. 2E, it is noted that portion 214EA of CDTI structure 214E is a center portion, or at the center of CDTI structure 214E in the pixel cell 204E. As such, a longitudinal center line 220E of the CDTI structure 214E extends through center portion 214EA as shown. It is noted that the longitudinal center line 220E is a line that extends into or out from the page, and is therefore illustrated as a point in FIG. 2E. In the example shown in FIG. 2E, the plurality of portions 214EA-214EY are arranged in a pattern of concentric shapes in the semiconductor layer 222E with portions 214EB-214EI arranged concentrically around center portion 214EA and portions 214EJ-214EY arranged concentrically around portions 214EB-214EI as shown. In the example CDTI structure 214E of FIG. 2E, the example concentric shapes of the plurality of portions 214EA-214EY are provided with a plurality or an array of pillar structures arranged in semiconductor layer 222E. As shown in the example of FIG. 2E, the pillar-shaped portions 214EB-214EI are arranged as a plurality of portions that collectively form a concentric ring around center portion 214EA. Similarly, the pillar-shaped portions 214EJ-214EY are arranged as a plurality of portions that form a concentric ring around center portion 214EA and portions 214EB-214EI as shown.

In the example shown in FIG. 2E, the portions 214EA, 214EB-214EI, and 214EJ-214EY have respective widths. The example illustrates the respective widths as W1, W2, W3. One difference between CDTI structure 214E of FIG. 2E and CDTI structure 214C of FIG. 2C is that in the example CDTI structure 214E of FIG. 2E, the unequal relative relationships of the respective widths are W3>W2>W1. In other examples, it is appreciated that relative unequal relationships between W1, W2, W3 may be different.

As will be more apparent in another view below, the portions 214EA, 214EB-214EI, and 214EJ-214EY also extend a respective depth from the backside towards the front side of the semiconductor layer 222E. In the example, the respective depths of portions 214EA, 214EB-214EI, and 214EJ-214EY increase as the respective widths of portions 214EA, 214EB-214EI, and 214EJ-214EY increase due to the etch loading effect during manufacture. Thus, the respective depth of each of portions 214EA, 214EB-214EI, and 214EJ-214EY is different than a respective depth of a neighboring one of the plurality of portions 214EA, 214EB-214EI, and 214EJ-214EY that has a different respective width (e.g., W1, W2, W3).

In the illustrated example, it is noted that a nearest or closest neighboring portion of the portions 214EA, 214EB-214EI, and 214EJ-214EY in a direction along a lateral line that passes through the longitudinal center line 220E has a different respective width. For instance, it is noted that dashed line E-E' illustrated in FIG. 2E is an example of a lateral line that passes through the longitudinal center line 220E. As such, a nearest neighboring portion of center portion 214EA along dashed line E-E' among the portions 214EA, 214EB-214EI, and 214EJ-214EY is included in portions 214EB-214EI. Similarly, nearest neighbors of portions 214EB-214EI include portion 214EA or one of the portions 214EJ-214EY along dashed line E-E'. Thus, the respective width W1 of portion 214EA is different than the respective width W2 of portions 214EB-214EI, which is different that the respective width W3 of portions 214EJ-214EY. As will be shown in another view below, since the respective width W1 of center portion 214EA is less than the respective width W2 of portions 214EB-214EI, the respective depth of center portion 214EA is less than the respective depth of portions 214EB-214EI. Similarly, since the respective width W2 of portions 214EB-214EI is less than the respective width W3 of portions 214EJ-214EY, the respective depth of portions 214EB-214EI in the semiconductor layer 222E from backside of the semiconductor layer 222E is less than the respective depth of portions 214EJ-214EY. Thus, there is a difference in the respective widths and a corresponding difference in the respective depths between neighboring portions 214EA, 214EB-214EI, and 214EJ-214EY along the dashed line E-E'.

In one example, the plurality of portions 214EA, 214EB-214EI, and 214EJ-214EY of CDTI structure 214E may be arranged with a structural symmetry. For example, portions 214EB-214EI, and 214EJ-214EY are arranged symmetrical with respect to the center portion 214EA. For example, portions 214EB-214EI and 214EJ-214EY are arranged symmetrical with respect to longitudinal center line 220E. The structural symmetry of CDTI structure 214E may also help to increase light absorption as the incident light directed to the respective photodiode is symmetric.

In the example shown in FIG. 2E, dashed line E-E' through the longitudinal center line 220E is illustrated as a "horizontal" line for explanation purposes. It is appreciated that dashed line E-E' could also have been illustrated as a "vertical" line, a "diagonal" line, etc., through longitudinal center line 220E.

In the example illustrated in FIG. 2E, it is noted that pixel cell 204E also includes another or a second deep trench isolation (DTI) structure 236E, which surrounds the pixel cell 204E region of the semiconductor layer 222E. In the example, the DTI structure 236E therefore isolates or separates the pixel cell 204E from neighboring pixel cells in the pixel array. For instance, referring back to the example illustrated in FIG. 1, the DTI structure 236E surrounding each of the pixel cells 204E as shown in FIG. 2E forms collectively a grid structure 136 that provides a boundary between each of the pixel cells 104 in the pixel array 102 in FIG. 1.

As will be shown in greater detail below, in one example, the DTI structure 236E extends a DTI structure depth from the backside towards the front side of the semiconductor layer 222E to isolate or separate each of the pixel cells 204E from neighboring pixel cells. In one example, the DTI structure 236E extends the DTI structure depth from the backside into the semiconductor layer 222E toward the front side of the semiconductor layer 222E to form a partial backside deep trench isolation structure such that the DTI structure depth of DTI structure 236E is greater than the depth of CDTI structure 214E and less than the thickness of the semiconductor layer 222E between the backside and the front side. In another embodiment, the DTI structure depth of DTI structure 236E is substantially equal to the thickness of the semiconductor layer 222E such that the DTI structure 236E extends between the backside and the front side of the semiconductor layer 222E. In various examples, the DTI structure 236E may be formed of a low k material, an oxide material, or other suitable dielectric material in the semiconductor layer 222E. The DTI structure 236E may be formed with the same or different material as the CDTI structure 214E.

Figure 2F:
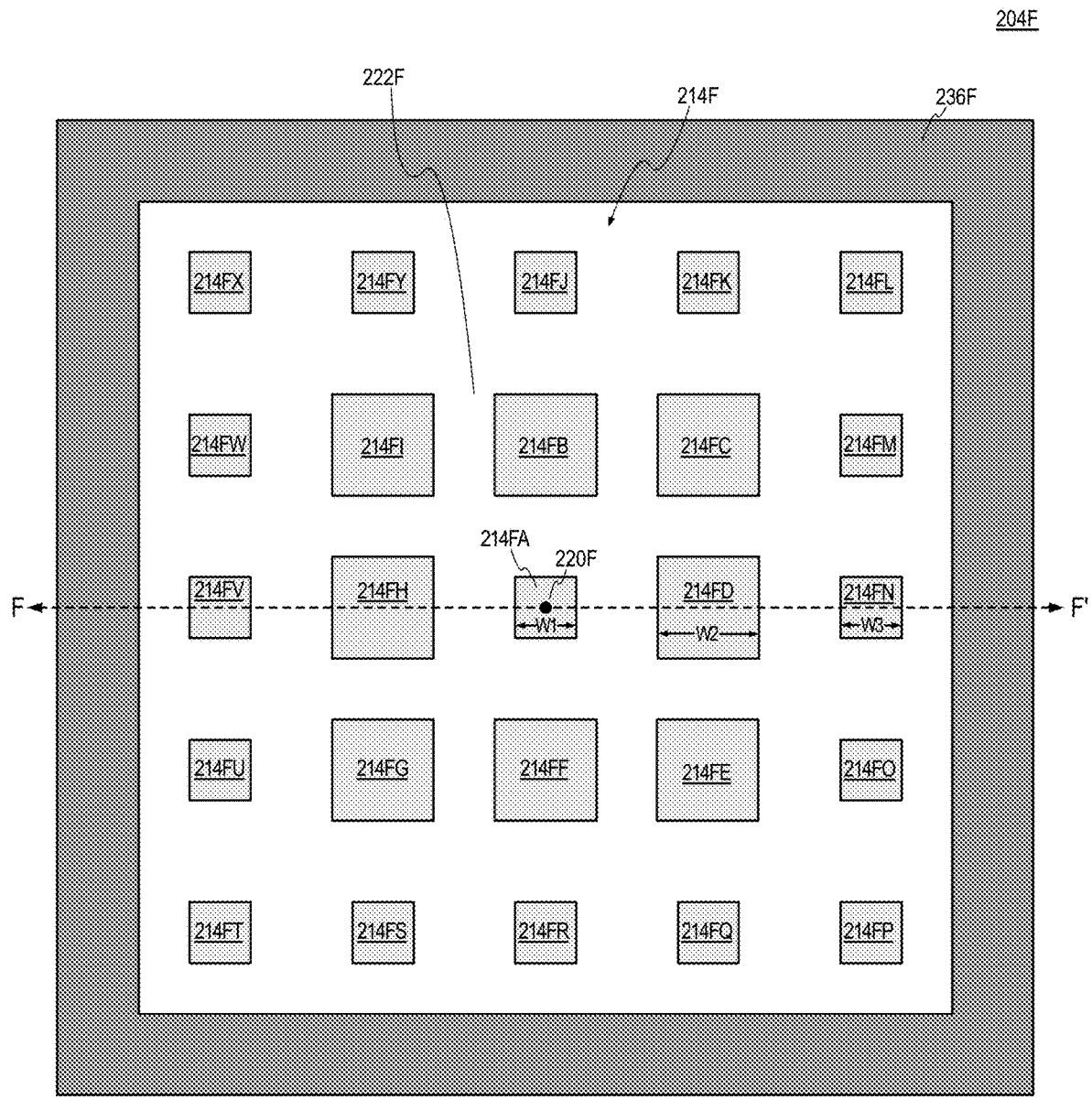
FIG. 2F shows a top view of a pixel cell illustrating still another example of a cell deep trench isolation structure in accordance with the teachings of the present invention.

FIG. 2F is an example top view a pixel cell 204F illustrating still another example of a CDTI structure 214F in accordance with the teachings of the present invention. It is noted that example pixel cell 204F of FIG. 2F may be also be an example of one or more of the pixel cells 104 of the example pixel array 102 of FIG. 1, and it should be appreciated that similarly named and numbered elements referenced below are coupled and function as described above. In addition, it is further appreciated that example pixel cell 204F of FIG. 2F shares many similarities with example pixel cell 204C of FIG. 2C and example pixel cell 204E of FIG. 2E.

For instance, as shown in the example depicted in FIG. 2F, pixel cell 204F includes a CDTI structure 214F disposed in a pixel cell 204F region of the semiconductor layer 222F. In one example, pixel cell 204F is adapted to detect incident light including NIR light or IR light. In the example, CDTI structure 214F is formed with a low k material, an oxide material, or other suitable dielectric material in the semiconductor layer 222F. In one example, the semiconductor layer 222F may include silicon or another suitable type of semiconductor material. As will be more apparent in another view below, example CDTI structure 214F is disposed proximate to a backside of the semiconductor layer 222F and along an optical path of incident light that is directed to a photodiode disposed proximate to a front side the semiconductor layer 222F along the optical path.

As shown in the top view of example of pixel cell 204F in FIG. 2F, CDTI structure 214F includes a plurality of portions, which are illustrated in the example as portions 214FA, 214FB, 214FC, 214FD, 214FE, 214FF, 214FG, 214FH, 214FI, 214FJ, 214FK, 214FL, 214FM, 214FN, 214FO, 214FP, 214FQ, 214FR, 214FS, 214FT, 214FU, 214FV, 214FW, 214FX, 214FY. In the example, each of the plurality of portions 214FA-214FY is laterally separated and spaced apart from a neighboring one of the plurality of portions 214FA-214FY in the semiconductor layer 222F. The spacing between each of the plurality of portions 214FA-214FY and a neighboring one of the plurality of portions 214FA-214FY in the semiconductor layer 222F can be the same or different depending at least on the configuration of CDTI structure 214F and pixel cell size.

In the example depicted in FIG. 2F, it is noted that portion 214FA of CDTI structure 214F is a center portion, or at the center of CDTI structure 214F in the pixel cell 204F. As such, a longitudinal center line 220F of the CDTI structure 214F extends through center portion 214FA as shown. It is noted that the longitudinal center line 220F is a line that extends into or out from the page, and is therefore illustrated as a point in FIG. 2F. In the example shown in FIG. 2F, the plurality of portions 214FA-214FY are arranged in a pattern of concentric shapes in the semiconductor layer 222F with portions 214FB-214FI arranged concentrically around center portion 214FA and portions 214FJ-214FY arranged concentrically around portions 214FB-214FI as shown. In the example CDTI structure 214F of FIG. 2F, the example concentric shapes of the plurality of portions 214FA-214FY are provided with a plurality or an array of pillar structures arranged in semiconductor layer 222F. As shown in the example of FIG. 2F, the pillar-shaped portions 214FB-214FI are arranged as a plurality of portions that collectively form a concentric ring around center portion 214FA. Similarly, the pillar-shaped portions 214FJ-214FY are arranged as a plurality of portions that form a concentric ring around center portion 214FA and portions 214FB-214FI as shown.

In the example shown in FIG. 2F, the portions 214FA, 214FB-214FI, and 214FJ-214FY have respective widths. The example illustrates the respective widths as W1, W2, W3. One difference between CDTI structure 214F of FIG. 2F and CDTI structure 214C of FIG. 2C and CDTI structure 214E of FIG. 2E is that in the example CDTI structure 214F of FIG. 2F, the unequal relative relationships of the respective widths are W1<W2 and W3<W2. In other examples, it is appreciated that relative unequal relationships between W1, W2, W3 may be different.

As will be more apparent in another view below, the portions 214FA, 214FB-214FI, and 214FJ-214FY also extend a respective depth from the backside towards the front side of the semiconductor layer 222F. In the example, the respective depth of portions 214FA, 214FB-214FI, and 214FJ-214FY increase as the respective widths of portions 214FA, 214FB-214FI, and 214FJ-214FY increase due to the dry etch loading effect during manufacture. Thus, the respective depth of each of portions 214FA, 214FB-214FI, and 214FJ-214FY is different than a respective depth of a neighboring one of the plurality of portions 214FA, 214FB-214FI, and 214FJ-214FY that has a different respective width (e.g., W1, W2, W3).

In the illustrated example, it is noted that a nearest or closest neighboring portion of the portions 214FA, 214FB-214FI, and 214FJ-214FY in a direction along a lateral line that passes through the longitudinal center line 220F has a different respective width. For instance, it is noted that dashed line F-F' illustrated in FIG. 2F is an example of a lateral line that passes through the longitudinal center line 220F. As such, a nearest neighboring portion of center portion 214FA along dashed line F-F' among the portions 214FA, 214FB-214FI, and 214FJ-214FY is included in portions 214FB-214FI. Similarly, nearest neighbors of portions 214FB-214FI include portion 214FA or one of the portions 214FJ-214FY along dashed line F-F'. Thus, the respective width W1 of portion 214FA is different than the respective width W2 of portions 214FB-214FI, which is different that the respective width W3 of portions 214FJ-214FY. As will be shown in another view below, since the respective width W1 of center portion 214FA is less than the respective width W2 of portions 214FB-214FI, the respective depth of center portion 214FA is less than the respective depth of portions 214FB-214FI, and so on. Thus, there is a difference in the respective widths and a corresponding difference in the respective depths between neighboring portions 214FA, 214FB-214FI, and 214FJ-214FY along the dashed line F-F'.

In the example shown in FIG. 2F, dashed line F-F' through the longitudinal center line 220F is illustrated as a "horizontal" line for explanation purposes. It is appreciated that dashed line F-F' could also have been illustrated as a "vertical" line, a "diagonal" line, etc., through longitudinal center line 220F.

In one example, the plurality of portions 214FA, 214FB-214FI, and 214FJ-214FY of CDTI structure 214F may be arranged with a structural symmetry. For example, portions 214FB-214FI, and 214FJ-214FY are arranged symmetrical with respect to the center portion 214FA to further improve light absorption.

In the example illustrated in FIG. 2F, it is noted that pixel cell 204F also includes another or a second deep trench isolation (DTI) structure 236F, which surrounds the pixel cell 204F region of the semiconductor layer 222F. In the example, the DTI structure 236F therefore isolates or separates the pixel cell 204F from neighboring pixel cells in the pixel array. For instance, referring back to the example illustrated in FIG. 1, the DTI structure 236F surrounding each of the pixel cells 204F as shown in FIG. 2F forms collectively a grid structure 136 that provides a boundary between each of the pixel cells 104 in the pixel array 102 in FIG. 1.

As will be shown in greater detail below, in one example, the DTI structure 236F extends a DTI structure depth from the backside towards the front side of the semiconductor layer 222F to isolate or separate each of the pixel cells 204F from neighboring pixel cells. In one example, the DTI structure 236F extends the DTI structure depth from the backside into the semiconductor layer 222F toward the front side of the semiconductor layer 222F to form a partial backside deep trench isolation structure such that the DTI structure depth of DTI structure 236F is greater than the depth of CDTI structure 214F and less than the thickness of the semiconductor layer 222F between the backside and the front side. In another embodiment, the DTI structure depth of DTI structure 236F is substantially equal to the thickness of the semiconductor layer 222F such that the DTI structure 236F extends between the backside and the front side of the semiconductor layer 222F. In various examples, the DTI structure 236F may be formed of a low k material, an oxide material, or other suitable dielectric material in the semiconductor layer 222F. The DTI structure 236F may be formed with the same or different material as the CDTI structure 214F.

Figure 3A:
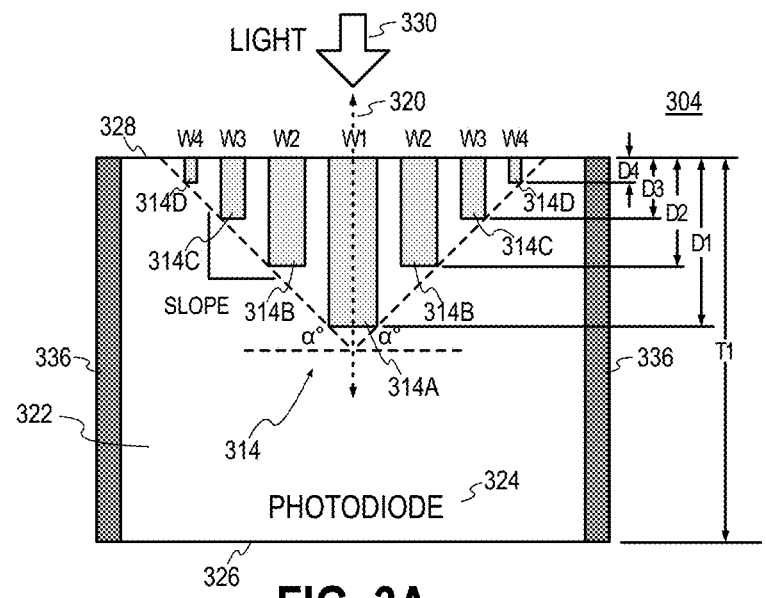
FIG. 3A shows a cross-section view of a pixel cell including an example cell deep trench isolation structure in accordance with the teachings of the present invention.

FIG. 3A shows a cross-section view of a pixel cell 304 including an example CDTI structure 314 in accordance with the teachings of the present invention. It is appreciated that example pixel cell 304 of FIG. 3A may be another view of example pixel cell 204A of FIG. 2A or of pixel cell 204B of FIG. 2B, and that similarly named and numbered elements referenced below are coupled and function as described above. It is also noted that the example cross-section view of pixel cell 304 shown in FIG. 3A may correspond to a cross-section view of pixel cell 204A of FIG. 2A along dashed line A-A' or of pixel cell 204B of FIG. 2B along dashed line B-B'.

As shown in the example depicted in FIG. 3A, pixel cell 304 includes a photodiode 324 disposed in a pixel cell 304 region of a semiconductor layer 322 and proximate to a front side 326 of the semiconductor layer 322 to generate image charge in response to incident light 330 that is directed through a backside 328 of the semiconductor layer 322 to the photodiode 324. The CDTI structure 314 is disposed in the pixel cell 304 region of the semiconductor layer 322 along an optical path of the incident light 330 to the photodiode 324 and the CDTI structure 314 is disposed proximate to a backside 328 of the semiconductor layer 322.

As shown in the illustrated example, the CDTI structure 314 includes a plurality of portions, which are shown in FIG. 3A as portions 314A, 314B, 314C, 314D arranged in the semiconductor layer 322. As shown, each of the plurality of portions 314A, 314B, 314C, 314D is laterally separated and spaced apart from a neighboring one of the plurality of portions 314A, 314B, 314C, 314D in the semiconductor layer 322. The spacing between each of the plurality of portions 314A, 314B, 314C, 314D and a neighboring one of the plurality of portions 314A, 314B, 314C, 314D in the semiconductor layer 322 can be the same or different.

As shown in the example, portion 314A has a width of W1, portion 314B has a width of W2, portion 314C has a width of W3, and portion 314D has a width of W4. In the example depicted in FIG. 3A, W1>W2>W3>W4. In other examples, it is appreciated that relative unequal relationships between W1, W2, W3, W4 may be different. In addition, each of the plurality of portions 314A, 314B, 314C, 314D extends a respective depth D1, D2, D3, D4 from the backside 328 towards the front side 326 of the semiconductor layer 322. In the example depicted in FIG. 3A, D1>D2>D3>D4. Thus, the respective depth D1, D2, D3, D4 of each of the plurality of portions 314A, 314B, 314C, 314D is different than a respective depth D1, D2, D3, D4 of a neighboring one of the plurality of portions 314A, 314B, 314C, 314D. In the example the respective depth D1, D2, D3, D4 of each of the plurality of portions 314A, 314B, 314C, 314D is related to the respective widths of the plurality of portions 314A, 314B, 314C, 314D. In the various examples, as the relative width of a portion 314A, 314B, 314C, 314D increases, the relative depth of that portion 314A, 314B, 314C, 314D increases due to the etch loading effect during manufacture. In other words, shallower portions are provided with narrower portions, and deeper portions are provided with wider portions.

In one example, the plurality of portions 314A, 314B, 314C, 314D of CDTI structure 314 may be arranged with a structural symmetry to improve light absorption. For example, the cross-sections of portions 314B, 314C, 314D have symmetry with respect to the center portion 314A or the longitudinal center line 320. Further, CDTI structure 314 having a plurality of portions 314A, 314B, 314C, 314D also can increase light travel paths of incident light 330 within the respective pixel cell 304 as incident light 330 is scattered by plurality of portions 314A, 314B, 314C, 314D through reflection and/or refraction. Accordingly, the absorption of incident light 330 directed to the respective photodiode 324 of pixel cell 304 can be increased.

As depicted in the example illustrated in FIG. 3A, each of the plurality of portions 314A, 314B, 314C, 314D has a first end and a second end. In particular, the first end of each of the plurality of portions of the plurality of portions 314A, 314B, 314C, 314D is the end that is at the backside 328 of the semiconductor layer 322 and the second end of each of the plurality of portions 314A, 314B, 314C, 314D is opposite the first end and at the respective depth D1, D2, D3, D4 from the backside 328 towards the front side 326 in the semiconductor layer 322.

Accordingly, it is appreciated that the second ends of the plurality of portions 314A, 314B, 314C, 314D define or represent a surface having a cross-section that has a slope that is greater than zero with respect to the backside 328 of the semiconductor layer 322. The surface is illustrated or represented in FIG. 3A with the dashed lines having a slope, which is labeled "SLOPE" in FIG. 3A, having an angle, which is labeled "$\alpha°$" in FIG. 3A, relative to the backside 328 of semiconductor layer 322.

In one example, the second ends of the plurality of portions 314A, 314B, 314C, 314D on a first side (e.g., left side) of the longitudinal center line 320 define or represent a first surface plane with a first slope and the second ends of the plurality of portions 314A, 314B, 314C, 314D on a second side opposite to the first side (e.g., right side) of the longitudinal center line 320 define or represent a second surface plane with a second slope with respect to longitudinal center line 320 normal to the backside 328, wherein the first surface plane and the second surface intersects and connects forming an angle that is substantially equal to $180°-2\alpha°$. It is appreciated that the slope SLOPE increases as the difference between respective depths D1, D2, D3, D4 of neighboring portions 314A, 314B, 314C, 314D increases. Thus, by adjusting the difference between the widths W1, W2, W3, W4 of neighboring portions 314A, 314B, 314C, 314D modulating the difference between depths D1, D2, D3, D4 of neighboring portions 314A, 314B, 314C, 314D, the slope SLOPE of the surface defined by the second ends of the plurality of portions 314A, 314B, 314C, 314D can also be adjusted in accordance with the teachings of the present invention.

In the example depicted in FIG. 3A, it is appreciated that the center portion 314A through which the longitudinal center line 320 of pixel cell 304 passes, is the widest (W1) and therefore the deepest (D1) portion 314A of CDTI structure 314 and that each successive neighboring portion (314B, 314C, 314D) that is further from the longitudinal center line 320 decreases in depth (D2, D3, D4). As such, it is noted that CDTI structure 314 therefore provides a reversed or inverted pyramid shaped structure with sides having an angle $\alpha°$ as shown. The larger the angle $\alpha°$, the steeper or the larger the slope SLOPE associated with the side surface plane formed by the portions 314B, 314C, 314D. The larger the slope SLOPE results in a larger refraction angle for incident light 330 incident on the portions 314B, 314C, 314D, which thereby increases light absorption.

Accordingly, the provided reversed or inverted pyramid shaped from tilted or slanted cross-section surface planes formed by the plurality of portions 314A, 314B, 314C, 314D enhances the light absorption of incident light 330 directed to the photodiode 324 of the respective pixel cell 304 by reflection and/or refraction, thereby increases the light sensitivity of respective pixel cell 304, for example, to incident light with longer wavelengths (e.g., red light, NIR light, and/or IR light). It is therefore appreciated that near infrared (NIR) quantum efficiency (QE) is significantly enhanced with CDTI structure 314. In various examples, the spacing between the neighboring portions 314A, 314B, 314C, 314D and the relative widths W1, W2, W3, W4 can be configured based on minimum design rules and a specific slope SLOPE to provide the pyramid/geometric-like shape with desired reflection/refracting angle for optimal light reflection and NIR absorption performance of pixel cell 304 in accordance with the teachings of the present invention. In addition, it is appreciated that CDTI structure 314 provides improved crosstalk performance.

The example cross-section view illustrated in FIG. 3A also shows that pixel cell 304 also includes another or a second DTI structure 336 that surrounds the pixel cell 304 region of the semiconductor layer 322. As illustrated in the depicted example, the DTI structure 336 extends a DTI structure depth T1 from the backside 328 towards the front side 326 of the semiconductor layer 322 to isolate or separate each of the pixel cells 304 from neighboring pixel cells in the pixel array. In depicted example, the DTI structure depth T1 is greater than the depth D1 of CDTI structure 314 and substantially equal to the thickness of the semiconductor layer 322 such that DTI structure 336 extends from the backside 328 to the front side 326 of the semiconductor layer 322. In another example, it is appreciated that DTI structure 336 extends from the backside 328 a depth into the semiconductor layer 322 toward the front side 326 of the semiconductor layer 322 greater than the depth of CDTI structure 314 and less than the thickness of semiconductor layer 322 to form a partial backside DTI structure. In the various examples, the DTI structure 336 may be formed of a low k material, an oxide material, or other suitable dielectric material in the semiconductor layer 322. The DTI structure 336 may be formed with the same or different material as the CDTI structure 314.

Figure 3B:
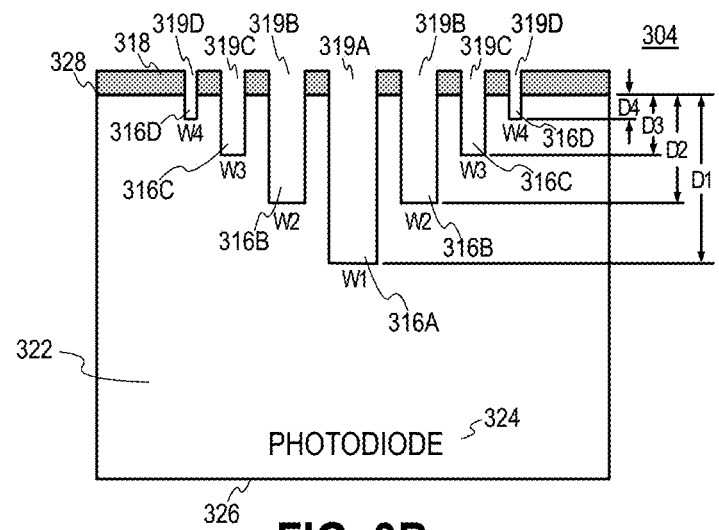
FIG. 3B shows an example cross-section view during a manufacturing process of the pixel cell of FIG. 3A in accordance with the teachings of the present invention.

FIG. 3B shows an example cross-section view during a manufacturing process of the pixel cell 304 of FIG. 3A in accordance with the teachings of the present invention. In the example, the a semiconductor layer 322 is provided, which includes a photodiode 324 disposed in a pixel cell 304 region of the semiconductor layer 322 and proximate to a front side 326 of the semiconductor layer 322 to generate image charge in response to incident light that is directed through a backside 328 of the semiconductor layer 322 to the photodiode 324. The photodiode 324 can be formed in the semiconductor layer 322, for example by ion implantation. The semiconductor layer 322 shown in FIG. 3B may be the semiconductor layer 322 after front side processing, i.e., with the photodiode, transistors (including gates, sources, and drains), contacts, metal interconnects, etc., already fabricated.

A patterned mask layer 318 is deposited over the backside 328 of the semiconductor layer 322. As shown, the patterned mask layer 318 includes a pattern having a plurality of openings 319A, 319B, 319C, 319D having different widths W1, W2, W3, W4 corresponding to the respective portions of CDTI structure, wherein W1>W2>W3>24. Each of the plurality of openings 319A, 319B, 319C, 319D is laterally separated and spaced apart from a neighboring one of the plurality of openings 319A, 319B, 319C, 319D in the pattern in patterned mask layer 318. A respective width W1, W2, W3, W4 of each of the plurality of openings 319A, 319B, 319C, 319D is different than a respective width W1, W2, W3, W4 of a neighboring one of the plurality of openings 319A, 319B, 319C, 319D.

The backside 328 of semiconductor layer 322 is then etched through the plurality of openings 319A, 319B, 319C, 319D of patterned mask layer 318, for example by plasma etching, to form a plurality of trenches 316A, 316B, 316C, 316D in the semiconductor layer 322. Each one of the plurality of trenches 316A, 316B, 316C, 316D has a respective depth D1, D2, D3, D4 that extends from the backside 328 towards the front side 326 of the semiconductor layer 322. As discussed, since the respective width W1, W2, W3, W4 of each of the plurality of openings 319A, 319B, 319C, 319D is different than a respective width W1, W2, W3, W4 of a neighboring one of the plurality of openings 319A, 319B, 319C, 319D, the respective depth D1, D2, D3, D4 of each of the plurality of trenches 316A, 316B, 316C, 316D is different than a respective depth D1, D2, D3, D4 of a neighboring one of the plurality of trenches 316A, 316B, 316C, 316D due to the dry etch loading effect. The wider the trench width, the deeper the depth trench depth and the narrow the trench width, the shallow the trench depth.

Figure 3C:
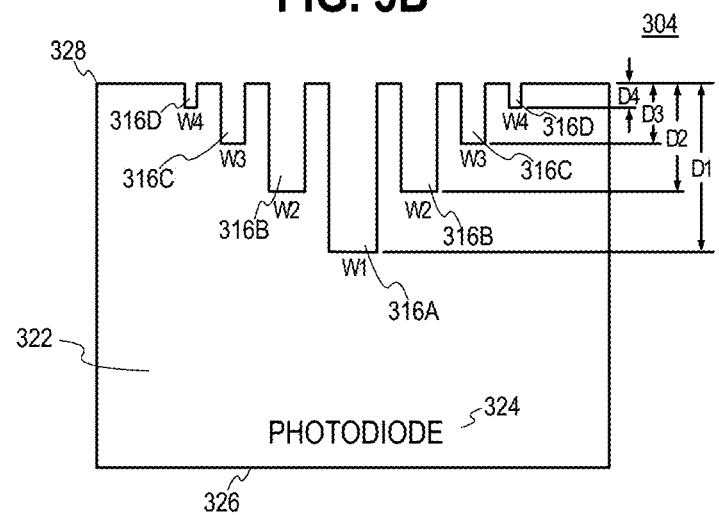
FIG. 3C shows another example cross-section view during the manufacturing process of the pixel cell of FIG. 3A in accordance with the teachings of the present invention.

FIG. 3C shows that after the plurality of trenches 316A, 316B, 316C, 316D are etched in the semiconductor layer 322, the semiconductor layer 322 is then stripped and cleaned to remove patterned mask layer 318.

Referring briefly back to FIG. 3A, the plurality of trenches 316A, 316B, 316C, 316D are then filled by depositing dielectric material in each of the plurality of trenches 316A, 316B, 316C, 316D to form the plurality of portions 314A, 314B, 314C, 314D of CDTI structure 314. In various examples, the plurality of trenches 316A, 316B, 316C, 316D may be filled with a low k material, an oxide material, or other suitable dielectric material. Then, a chemical mechanical polishing (CMP) process may be performed to polish or planarize the backside 328 of semiconductor layer 322. As will be shown in further examples below, one or more additional layers, such as for example a buffer oxide, an anti-reflection layer, etc., may then be formed over the backside 328 of semiconductor layer 322. In addition, color lenses of a color filter array and microlenses may then be formed over the backside 328 of semiconductor layer 322 to provide each pixel cell 304 of the pixel array.

Figure 3D:
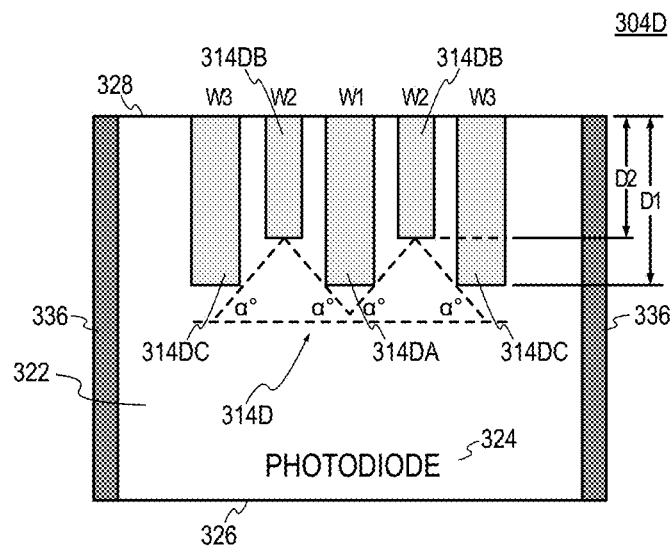
FIG. 3D shows a cross-section view of a pixel cell illustrating another example of a cell deep trench isolation structure in accordance with the teachings of the present invention.

FIG. 3D shows a cross-section view of a pixel cell 304D illustrating another example of a CDTI structure 314D in accordance with the teachings of the present invention. It is appreciated that example pixel cell 304D of FIG. 3D may be another view of example pixel cell 204D of FIG. 2D, and that similarly named and numbered elements referenced below are coupled and function as described above. It is also noted that the example cross-section view of pixel cell 304D shown in FIG. 3D may correspond to a cross-section view of pixel cell 204D of FIG. 2D along dashed line D-D'.

As shown in the example depicted in FIG. 3D, pixel cell 304D includes a photodiode 324 disposed in a pixel cell 304D region of a semiconductor layer 322 and proximate to a front side 326 of the semiconductor layer 322 to generate image charge in response to incident light that is directed through a backside 328 of the semiconductor layer 322 to the photodiode 324. The CDTI structure 314D is disposed in the pixel cell 304D region of the semiconductor layer 322 along an optical path of the incident light to the photodiode 324 and proximate to a backside 328 of the semiconductor layer 322.

As shown in the illustrated example, the CDTI structure 314D includes a plurality of portions, which are shown in FIG. 3D as portions 314DA, 314DB, 314DC arranged in the semiconductor layer 322. As shown, each of the plurality of portions 314DA, 314DB, 314DC is laterally separated and spaced apart from a neighboring one of the plurality of portions 314DA, 314DB, 314DC in the semiconductor layer 322.

As shown in the example, portion 314DA has a width of W1, portion 314DB has a width of W2, and portion 314DC has a width of W3. In the example depicted in FIG. 3D, W1>W2 and W3>W2. In other examples, it is appreciated that relative unequal relationships between W1, W2, W3 may be different. It is noted that in the example depicted in FIG. 3D, W1 is substantially equal to W3. In another example, it is appreciated that W1 may be unequal to W3. The example depicted in FIG. 3D also illustrates that each of the plurality of portions 314DA, 314DB, 314DC extends a respective depth D1, D2, D1 from the backside 328 towards the front side 326 of the semiconductor layer 322. In the example depicted in FIG. 3D, D1>D2. Thus, the respective depth D1, D2, D1 of each of the plurality of portions 314DA, 314DB, 314DC is different than a respective depth D1, D2, D1 of a neighboring one of the plurality of portions 314DA, 314DB, 314DC in relation to the respective widths. In the various examples, as the relative width of a portion 314DA, 314DB, 314DC increases, the relative depth D1, D2, D1 of that portion 314DA, 314DB, 314DC increases due to the etch loading effect during the etching process. In other words, shallower portions are provided with narrower portions, and deeper portions are provided with wider portions.

As depicted in the example illustrated in FIG. 3D, each of the plurality of portions 314DA, 314DB, 314DC has a first end and a second end. In particular, the first end of each of the plurality of portions of the plurality of portions 314DA, 314DB, 314DC is the end that is at the backside 328 of the semiconductor layer 322 and the second end of each of the plurality of portions 314DA, 314DB, 314DC is opposite the first end and at the respective depth D1, D2, D1 from the backside 328 towards the front side 326 in the semiconductor layer 322.

Accordingly, it is appreciated that the second ends of the plurality of portions 314DA, 314DB, 314DC define or represent a surface having a cross-section that has slopes that are greater than zero with respect to the backside 328 of the semiconductor layer 322 as shown with the dashed lines in FIG. 3D. In particular, the example shown in FIG. 3D illustrates dashed lines that represent the surface defined by the second ends of the plurality of portions 314DA, 314DB, 314DC having angles relative to the backside 328 of semiconductor layer 322, which are labeled "α°" in FIG. 3D. It is appreciated that the angles α° of the surface relative to the backside 328 increase as the difference between respective depths D1, D2, D1 of neighboring portions 314DA, 314DB, 314DC increase. Thus, by adjusting the difference between the widths W1, W2, W3 of neighboring portions 314DA, 314DB, 314DC, the slope of the surface defined by the second ends of the plurality of portions 314DA, 314DB, 314DC and the angle α° can also be adjusted in accordance with the teachings of the present invention for optimal optical performance. For example, the respective widths W1, W2, W3 of the plurality of portions 314DA, 314DB, 314DC can be designed such that the respective depths of the plurality of portions 314DA, 314DB, 314DC resulting in a larger angle α°, that defines the surface having a cross-section with large slope creating larger refraction angle for incident light incident on the portions 314DA, 314DB, 314DC, which increases light absorption.

With CDTI structure 314D, and the angles α° provided by the specific structural configuration and arrangement of CDTI structure 314D, it is noted that crosstalk performance and that near infrared (NIR) quantum efficiency (QE) is significantly enhanced and with CDTI structure 314D.

The example cross-section view illustrated in FIG. 3D also shows that pixel cell 304D also includes another or a second DTI structure 336 that surrounds the pixel cell 304D region of the semiconductor layer 322 to isolate or separate each of the pixel cells 304D from neighboring pixel cells in the pixel array. In depicted example, the DTI structure depth is greater than the depth D1 of CDTI structure 314D and substantially equal to the thickness of the semiconductor layer 322 such that DTI structure 336 extends from the backside 328 to the front side 326 of the semiconductor layer 322. In another example, it is appreciated that DTI structure 336 extends from the backside 328 a depth into the semiconductor layer 322 toward the front side 326 of the semiconductor layer 322 greater than the depth of CDTI structure 314D and less than the thickness of semiconductor layer 322 to form a partial backside DTI structure. In the various examples, the DTI structure 336 may be formed of a low k material, an oxide material, or other suitable dielectric material in the semiconductor layer 322. The DTI structure 336 may be formed with the same or different material as the CDTI structure 314D.

Figure 3E:
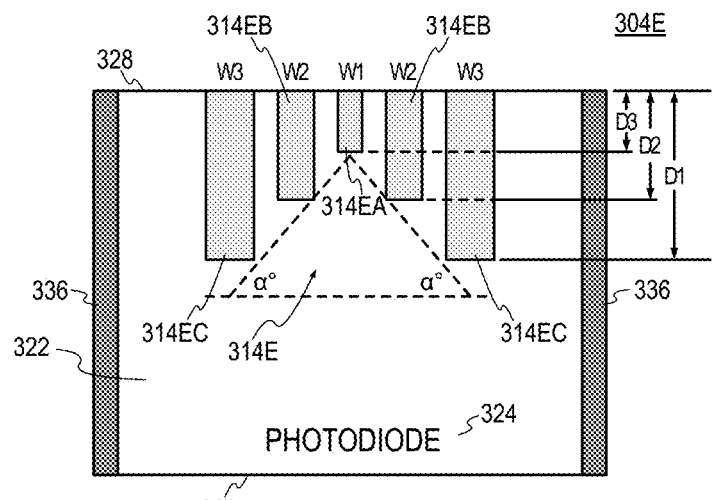
FIG. 3E shows a cross-section view of a pixel cell illustrating yet another example of a cell deep trench isolation structure in accordance with the teachings of the present invention.

FIG. 3E shows a cross-section view of a pixel cell 304E illustrating yet another example of a CDTI structure 314E in accordance with the teachings of the present invention. It is appreciated that example pixel cell 304E of FIG. 3E may be another view of example pixel cell 204E of FIG. 2E, and that similarly named and numbered elements referenced below are coupled and function as described above. It is also noted that the example cross-section view of pixel cell 304E shown in FIG. 3E may correspond to a cross-section view of pixel cell 204E of FIG. 2E along dashed line E-E'.

As shown in the example depicted in FIG. 3E, pixel cell 304E includes a photodiode 324 disposed in a pixel cell 304E region of a semiconductor layer 322 and proximate to a front side 326 of the semiconductor layer 322 to generate image charge in response to incident light that is directed through a backside 328 of the semiconductor layer 322 to the photodiode 324. The CDTI structure 314E is disposed in the pixel cell 304E region of the semiconductor layer 322 along an optical path of the incident light to the photodiode 324 and proximate to a backside 328 of the semiconductor layer 322.

As shown in the illustrated example, the CDTI structure 314E includes a plurality of portions, which are shown in FIG. 3E as portions 314EA, 314EB, 314EC arranged in the semiconductor layer 322. As shown, each of the plurality of portions 314DA, 314DB, 314DC is laterally separated and spaced apart from a neighboring one of the plurality of portions 314EA, 314EB, 314EC in the semiconductor layer 322.

In one example, the plurality of portions 314EA, 314EB, 314EC of CDTI structure 314E may be arranged with a structural symmetry. For example, the cross-sections of portions 314EB, 314EC may have symmetry with respect to the center portion 314EA to further improve light absorption to incident light directed to photodiode 324.

As shown in the example, portion 314EA has a width of W1, portion 314EB has a width of W2, and portion 314EC has a width of W3. In the example depicted in FIG. 3E, W3>W2>W1. In other examples, it is appreciated that relative unequal relationships between W1, W2, W3 may be different. The example depicted in FIG. 3E also illustrates that each of the plurality of portions 314EA, 314EB, 314EC extends a respective depth D3, D2, D1 from the backside 328 towards the front side 326 of the semiconductor layer 322. In the example depicted in FIG. 3E, D1>D2>D3. Thus, the respective depth D3, D2, D1 of each of the plurality of portions 314EA, 314EB, 314EC is different than a respective depth D1, D2, D1 of a neighboring one of the plurality of portions 314EA, 314EB, 314EC. In the various examples, as the relative width of a portion 314EA, 314EB, 314EC increases, the relative depth D3, D2, D1 of that portion 314EA, 314EB, 314EC increases due to the dry etch loading effect during manufacture. In other words, shallower portions are provided with narrower portions, and deeper portions are provided with wider portions.

As depicted in the example illustrated in FIG. 3E, each of the plurality of portions 314EA, 314EB, 314EC has a first end and a second end. In particular, the first end of each of the plurality of portions of the plurality of portions 314EA, 314EB, 314EC is the end that is at the backside 328 of the semiconductor layer 322 and the second end of each of the plurality of portions 314EA, 314EB, 314EC is opposite the first end and at the respective depth D3, D2, D1 from the backside 328 towards the front side 326 in the semiconductor layer 322.

Accordingly, it is appreciated that the second ends of the plurality of portions 314EA, 314EB, 314EC define or represent a surface having a cross-section that has slopes that are greater than zero with respect to the backside 328 of the semiconductor layer 322 as shown with the dashed lines in FIG. 3E. In particular, the example shown in FIG. 3E illustrates dashed lines that represent the surface defined by the second ends of the plurality of portions 314EA, 314EB, 314EC having angles relative to the backside 328 of semiconductor layer 322, which are labeled "α°" in FIG. 3E.

It is also noted that in the example shown in FIG. 3E, the center portion 314EA is the narrowest (W1) and therefore the shallowest (D3) portion 314EA of CDTI structure 314E and that each successive neighboring portion (314EB, 314EC) that is further from the center increases in depth (D2, D1). As such, it is noted that CDTI structure 314E therefore provides a pyramid shaped structure with sides having an angle α° as shown. By adjusting the widths W1, W2, W3 of neighboring portions 314EA, 314EB, 314EC, the slope of the surface defined by the second ends of the plurality of portions 314EA, 314EB, 314EC and the angle α° with respect to backside 328 of semiconductor layer 322 can also be adjusted to achieve desire optical performance. For example, the respective widths W1, W2, W3 of the plurality of portions 314EA, 314EB, 314EC can be designed such that the difference between respective depths of the neighboring portions 314EA, 314EB, 314EC provide in a larger angle α° resulting in a surface having a cross-section with larger slopes, which increase absorption of incident light within the respective pixel cell 304E by reflection and/or refraction for the incident light on the portions 314EA, 314EB, 314EC, which improves light sensitivity of the respective pixel cell 304E. It is therefore appreciated it is noted that crosstalk performance and that near infrared (NIR) quantum efficiency (QE) is significantly enhanced and with CDTI structure 314E and the angles α° provided by CDTI structure 314E.

The example cross-section view illustrated in FIG. 3E also shows that pixel cell 304E also includes another or a second DTI structure 336 that surrounds the pixel cell 304E region of the semiconductor layer 322 to isolate or separate each of the pixel cells 304E from neighboring pixel cells in the pixel array. In depicted example, the DTI structure depth is greater than the depth D1 of CDTI structure 314E and substantially equal to the thickness of the semiconductor layer 322 such that DTI structure 336 extends from the backside 328 to the front side 326 of the semiconductor layer 322. In another example, it is appreciated that DTI structure 336 extends from the backside 328 a depth into the semiconductor layer 322 toward the front side 326 of the semiconductor layer 322 greater than the depth of CDTI structure 314E and less than the thickness of semiconductor layer 322 to form a partial backside DTI structure. In the various examples, the DTI structure 336 may be formed of a low k material, an oxide material, or other suitable dielectric material in the semiconductor layer 322. The DTI structure 336 may be formed with the same or different material as the CDTI structure 314E.

Figure 3F:
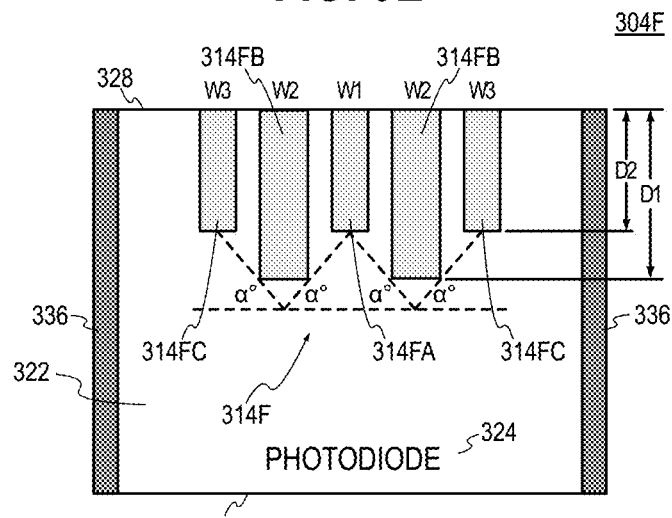
FIG. 3F shows a cross-section view of a pixel cell illustrating still another example of a cell deep trench isolation structure in accordance with the teachings of the present invention.

FIG. 3F shows a cross-section view of a pixel cell 304F illustrating still another example of a CDTI structure 314F in accordance with the teachings of the present invention. It is appreciated that example pixel cell 304F of FIG. 3F may be another view of example pixel cell 204F of FIG. 2F, and that similarly named and numbered elements referenced below are coupled and function as described above. It is also noted that the example cross-section view of pixel cell 304F shown in FIG. 3F may correspond to a cross-section view of pixel cell 204F of FIG. 2F along dashed line F-F'.

As shown in the example depicted in FIG. 3F, pixel cell 304F includes a photodiode 324 disposed in a pixel cell 304F region of a semiconductor layer 322 and proximate to a front side 326 of the semiconductor layer 322 to generate image charge in response to incident light that is directed through a backside 328 of the semiconductor layer 322 to the photodiode 324. The CDTI structure 314F is disposed in the pixel cell 304F region of the semiconductor layer 322 along an optical path of the incident light to the photodiode 324 and proximate to a backside 328 of the semiconductor layer 322.

As shown in the illustrated example, the CDTI structure 314F includes a plurality of portions, which are shown in FIG. 3F as portions 314FA, 314FB, 314FC arranged in the semiconductor layer 322. As shown, each of the plurality of portions 314FA, 314FB, 314FC is laterally separated and spaced apart from a neighboring one of the plurality of portions 314FA, 314FB, 314FC in the semiconductor layer 322.

As shown in the example, portion 314FA has a width of W1, portion 314FB has a width of W2, and portion 314FC has a width of W3. In the example depicted in FIG. 3F, W1<W2 and W3<W2. In other examples, it is appreciated that relative unequal relationships between W1, W2, W3 may be different. It is noted that in the example depicted in FIG. 3F, W1 is substantially equal to W3. In another example, it is appreciated that W1 may be unequal to W3. The example depicted in FIG. 3F also illustrates that each of the plurality of portions 314FA, 314FB, 314FC extends a respective depth D2, D1, D2 from the backside 328 towards the front side 326 of the semiconductor layer 322. In the example depicted in FIG. 3F, D1>D2. Thus, the respective depth D2, D1, D2 of each of the plurality of portions 314FA, 314FB, 314FC is different than a respective depth D2, D1, D2 of a neighboring one of the plurality of portions 314FA, 314FB, 314FC. In the various examples, as the relative width of a portion 314FA, 314FB, 314FC increases, the relative depth D2, D1, D2 of that portion 314FA, 314FB, 314FC increases due to the etch loading effect during manufacture, e.g., during dry etching process for forming trench associated with portions 314FA, 314FB, 314FC. In other words, shallower portions are provided with narrower portions, and deeper portions are provided with wider portions.

In one example, the plurality of portions 314FA, 314FB, 314FC of CDTI structure 314F may be arranged with a structural symmetry. For example, the cross-sections of portions 314FB, 314FC have symmetry with respect to the center portion 314FA to further improve light absorption.

As depicted in the example illustrated in FIG. 3F, each of the plurality of portions 314FA, 314FB, 314FC has a first end and a second end. In particular, the first end of each of the plurality of portions of the plurality of portions 314FA, 314FB, 314FC is the end that is at the backside 328 of the semiconductor layer 322 and the second end of each of the plurality of portions 314FA, 314FB, 314FC is opposite the first end and at the respective depth D2, D1, D2 from the backside 328 towards the front side 326 in the semiconductor layer 322.

Accordingly, it is appreciated that the second ends of the plurality of portions 314FA, 314FB, 314FC define or represent a surface having a cross-section that has slopes that are greater than zero with respect to the backside 328 of the semiconductor layer 322 as shown with the dashed lines in FIG. 3F. In particular, the example shown in FIG. 3F illustrates dashed lines that represent the surface defined by the second ends of the plurality of portions 314FA, 314FB, 314FC having angles relative to the backside 328 of semiconductor layer 322, which are labeled "α°" in FIG. 3F. It is appreciated that the angles α° of the surface relative to the backside 328 increase as the difference between respective depths D2, D1, D2 of neighboring portions 314FA, 314FB, 314FC increase. Thus, by adjusting the difference between the widths W1, W2, W3 of neighboring portions 314FA, 314FB, 314FC, which provide different depths between neighboring portions 314FA, 314FB, 314FC, the angle α° and the slope of the surface defined by the second ends of the plurality of portions 314FA, 314FB, 314FC can also be adjusted in accordance with the teachings of the present invention. For example, the respective widths W1, W2, W3 of the plurality of portions 314FA, 314FB, 314FC can be designed such that the difference between respective depths of the neighboring portions 314FA, 314FB, 314FC provide a larger angle α° resulting in a surface having a cross-section with a larger slopes, which increase absorption of incident light within the respective pixel cell 304F by reflection and/or refraction of incident light incident on the portions 314FA, 314FB, 314FC, which improve light sensitivity of the respective pixel cell 304F. With CDTI structure 314F and the angles α° provided by CDTI structure 314F, it is noted that crosstalk performance and that near infrared (NIR) quantum efficiency (QE) is significantly enhanced and with CDTI structure 314F.

The example cross-section view illustrated in FIG. 3F also shows that pixel cell 304F also includes another or a second DTI structure 336 that surrounds the pixel cell 304F region of the semiconductor layer 322 to isolate or separate each of the pixel cells 304F from neighboring pixel cells in the pixel array. In depicted example, the DTI structure depth is greater than the depth D1 of CDTI structure 314F and substantially equal to the thickness of the semiconductor layer 322 such that DTI structure 336 extends from the backside 328 to the front side 326 of the semiconductor layer 322. In another example, it is appreciated that DTI structure 336 extends from the backside 328 a depth into the semiconductor layer 322 toward the front side 326 of the semiconductor layer 322 greater than the depth of CDTI structure 314F and less than the thickness of semiconductor layer 322 to form a partial backside DTI structure. In the various examples, the DTI structure 336 may be formed of a low k material, an oxide material, or other suitable dielectric material in the semiconductor layer 322. The DTI structure 336 may be formed with the same or different material as the CDTI structure 314F.

Figure 4A:
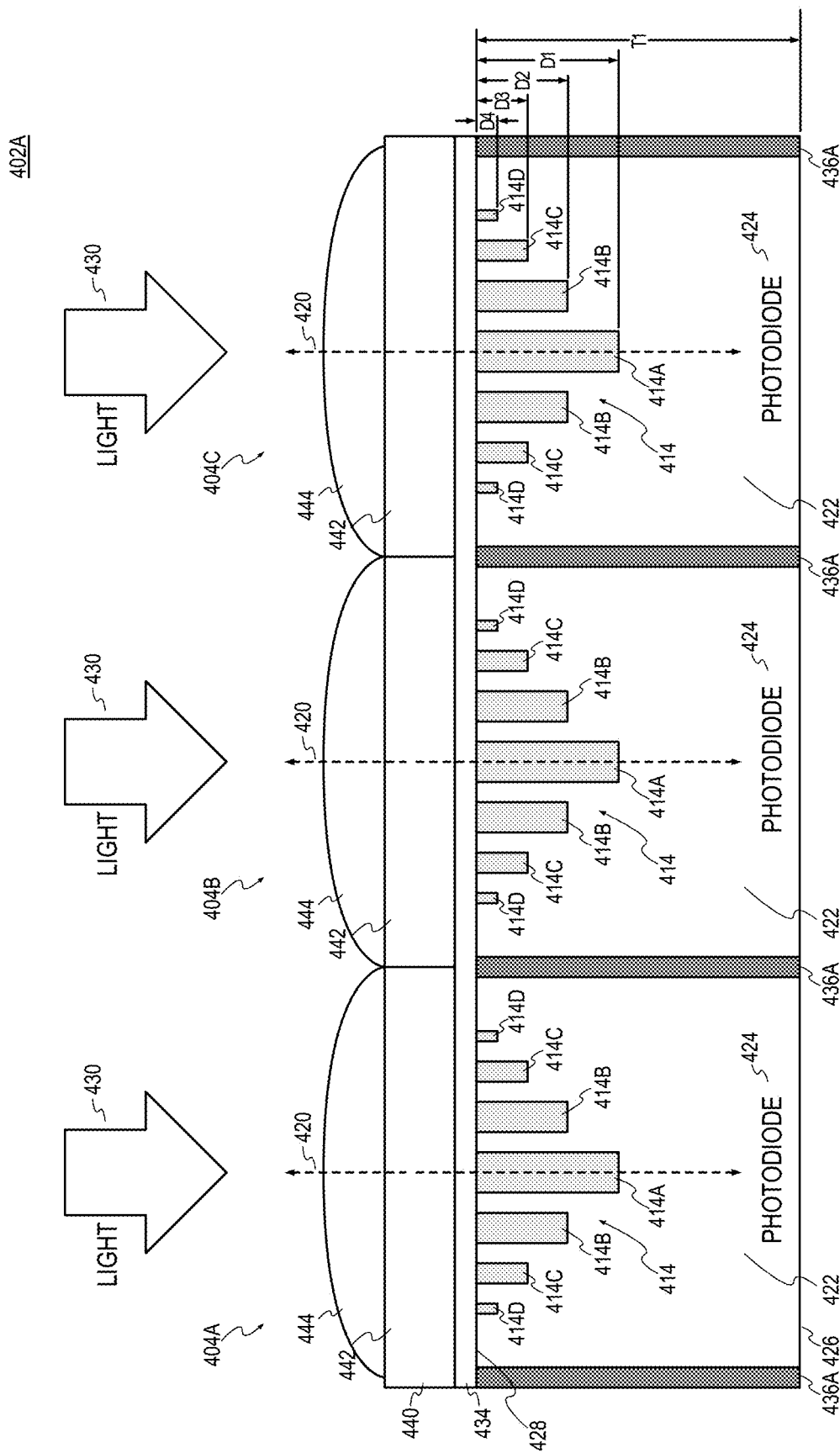
FIG. 4A is a cross-section view of one example of an array of pixel cells with cell deep trench isolation structures in accordance with the teachings of the present invention.

FIG. 4A is a cross-section view of one example of a color pixel array 402A including example pixel cells 404A, 404B, 404C with CDTI structures in accordance with the teachings of the present invention. It is appreciated that the example pixel cells 404A, 404B, 404C of FIG. 4A may be examples of pixel cell 204A of FIG. 2A or pixel cell 204B of FIG. 2B, and that similarly named and numbered elements referenced below are coupled and function as described above. In particular, it is noted that the example cross-section view of pixel cells 404A, 404B, 404C in FIG. 4A may correspond to the cross-section view of pixel cell 304A of FIG. 3A. However, it is appreciated that in other examples, each of the example pixel cells 404A, 404B, 404C may also have CDTI structure arranged according to any of FIGS. 2B-2F and/or with respective cross-sections as illustrated in any of FIGS. 3D-3F.

As shown in FIG. 4A, example color pixel array 402A includes a plurality of pixel cells including pixel cell 404A, 404B, 404C. Each of the pixel cells 404A, 404B, 404C includes a photodiode 424 disposed in a respective pixel cell region of a semiconductor layer 422 and proximate to a front side 426 of the semiconductor layer 422 to generate image charge in response to incident light 430 that is directed through a backside 428 of the semiconductor layer 422 to the photodiode 424. The semiconductor layer 422 may be an epitaxial layer formed on a semiconductor substrate. The CDTI structure 414 of each pixel cell 404A, 404B, 404C is disposed in the pixel cell region of the semiconductor layer 422 along an optical path of the incident light 430 to the photodiode 424 and proximate to a backside 428 of the semiconductor layer 422. In the example illustrated in FIG. 4A, each CDTI structure 414 includes a plurality of portions, which are shown in FIG. 4A as portions 414A, 414B, 414C, 414D arranged in the semiconductor layer 422. As shown, each of the plurality of portions 414A, 414B, 414C, 414D is laterally separated and spaced apart from a neighboring one of the plurality of portions 414A, 414B, 414C, 414D in the semiconductor layer 422.

As shown in the example, each of the plurality of portions 414A, 414B, 414C, 414D has a respective width and extends a respective depth D1, D2, D3, D4 from the backside 428 towards the front side 426 of the semiconductor layer 422. In the example depicted in FIG. 4A, D1>D2>D3>D4. Thus, the respective depth D1, D2, D3, D4 of each of the plurality of portions 414A, 414B, 414C, 414D is different than a respective depth D1, D2, D3, D4 of a neighboring one of the plurality of portions 414A, 414B, 414C, 414D. In the various examples, as the relative width of a portion 414A, 414B, 414C, 414D increases, the relative depth of that portion 414A, 414B, 414C, 414D increases due to the etch loading effect during etching the process for forming respective trenches of the portion 414A, 414B, 414C, 414D of CDTI structure 414. In other words, shallower portions are provided with narrower portions, and deeper portions are provided with wider portions.

The example cross-section view illustrated in FIG. 4A also shows that pixel cells 404A, 404B, 404C of color pixel array 402A include another or a second DTI structure 436A that surrounds the respective pixel cell 404A, 404B, 404C regions of the semiconductor layer 422. As illustrated in the depicted example, the DTI structure 436A extends a DTI structure depth T1 from the backside 428 to the front side 426 of the semiconductor layer 422 to isolate or separate each of the pixel cells 404A, 404B, 404C from neighboring pixel cells in the pixel array. As shown in the depicted example, the DTI structure depth T1 is greater than the depth D1 of the CDTI structures 414 and is substantially equal to the thickness between the backside 428 and the front side 426 of the semiconductor material layer 422. The DTI structure 436A may be formed of a low k material, an oxide material, or other suitable dielectric material in the semiconductor layer 422. The DTI structure 436A may be formed with the same or different material as the CDTI structures 414.

The example pixel array 402A shown in FIG. 4A also includes a buffer oxide layer 434 formed over the backside 428 of the semiconductor layer 422. In addition, a color filter array layer including a plurality of color filters 442 is formed over the buffer oxide layer 434. In one example, the color filers 442 may include a variety of different color filters including a combination of red, green, blue, clear/IR, etc. In one example, the plurality of color filters 442 may have an arrangement based on a Bayer pattern. A microlens layer including a plurality of microlenses 444 is formed over the color filters 442 of the color filter layer.

As shown in the depicted example, each microlens 444 and each color filter 442 is formed over and aligned with a respective CDTI structure 414 and photodiode 424 of the respective pixel cell 404A, 404B, 404C. As such, the optical path along which incident light 430 is directed passes through a respective microlens 444, color filter 442, oxide layer 434, backside 428, along and through CDTI structure 414, and through semiconductor layer 422 to photodiode 424 as shown.

Although example pixel cells 404A, 404B, 404C have the same CDTI structure arrangement as illustrated in FIG. 4A, it is appreciated that in other examples, pixel cells 404A, 404B, 404C may have different CDTI arrangements. For example, different color pixel cells can have different CDTI structure configurations. In one example, color pixel cells with shorter wavelengths such as blue, green and color pixel cells with longer wavelengths such as red, near infrared, infrared, clear may be arranged with different CDTI structure configurations, e.g., different CDTI structure patterns arrangement, different structural shapes, and/or different widths/depths associated with portions of CDTI structure, to achieve optimal optic performance of the image sensor for specific applications. In one example, pixel cells adopted to detect visible light (e.g., red, blue, green) and pixel cells adapted to detect near infrared light may be arranged with different CDTI structure configurations. In one example, pixel cells of different sizes may be arranged with different CDTI structure configurations.

Figure 4B:
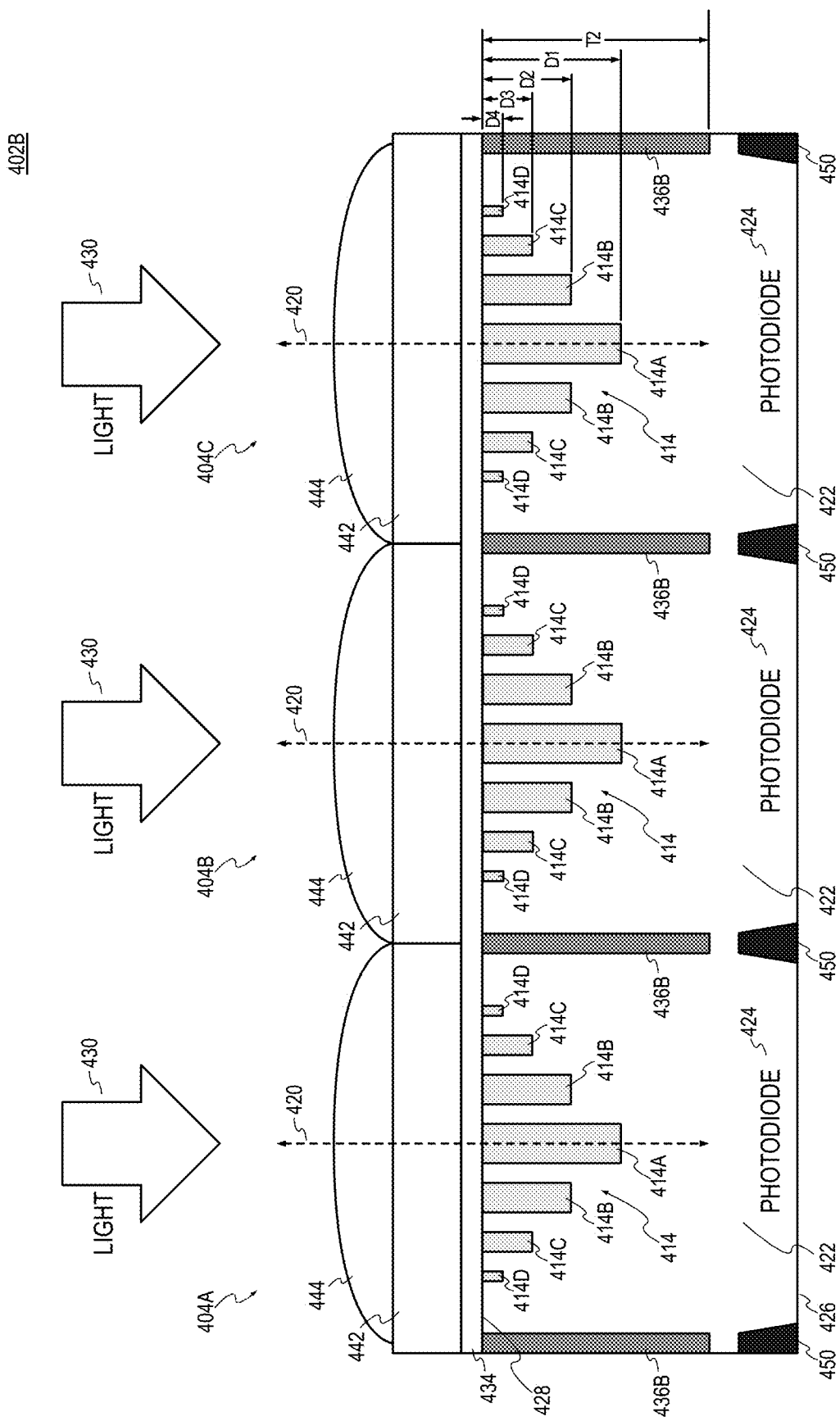
FIG. 4B is a cross-section view of another example of an array of pixel cells with cell deep trench isolation structures in accordance with the teachings of the present invention.

FIG. 4B is a cross-section view of another example a color pixel array 402B including example pixel cells 404A, 404B, 404C with CDTI structures in accordance with the teachings of the present invention. It is appreciated that the example pixel cells 404A, 404B, 404C of FIG. 4B may also be examples of pixel cell 204A of FIG. 2A or pixel cell 204B of FIG. 2B, and that similarly named and numbered elements referenced below are coupled and function as described above. In particular, it is noted that the example cross-section view of pixel cells 404A, 404B, 404C in FIG. 4A may correspond to the cross-section view of pixel cell 304A of FIG. 3A. It is also appreciated that color pixel array 402B of FIG. 4B shares many similarities with color pixel array 402A of FIG. 4A.

For instance, the example color pixel array 402B depicted in FIG. 4B includes a plurality of pixel cells including pixel cells 404A, 404B, 404C. Each of the pixel cells 404A, 404B, 404C includes a photodiode 424 disposed in a respective pixel cell region of a semiconductor layer 422 and proximate to a front side 426 of the semiconductor layer 422 to generate image charge in response to incident light 430 that is directed through a backside 428 of the semiconductor layer 422 to the photodiode 424. The semiconductor layer 422 may be an epitaxial layer formed on a semiconductor substrate. The CDTI structure 414 of each pixel cell 404A, 404B, 404C is disposed in the pixel cell region of the semiconductor layer 422 along an optical path of the incident light 430 to the photodiode 424 and proximate to a backside 428 of the semiconductor layer 422. In the example illustrated in FIG. 4B, each CDTI structure 414 includes a plurality of portions, which are shown in FIG. 4B as portions 414A, 414B, 414C, 414D arranged in the semiconductor layer 422. As shown, each of the plurality of portions 414A, 414B, 414C, 414D is laterally separated and spaced apart from a neighboring one of the plurality of portions 414A, 414B, 414C, 414D in the semiconductor layer 422.

As shown in the example, each of the plurality of portions 414A, 414B, 414C, 414D has a respective width and extends a respective depth D1, D2, D3, D4 from the backside 428 towards the front side 426 of the semiconductor layer 422. In the example depicted in FIG. 4B, D1>D2>D3>D4. Thus, the respective depth D1, D2, D3, D4 of each of the plurality of portions 414A, 414B, 414C, 414D is different than a respective depth D1, D2, D3, D4 of a neighboring one of the plurality of portions 414A, 414B, 414C, 414D. In the various examples, as the relative width of a portion 414A, 414B, 414C, 414D increases, the relative depth of that portion 414A, 414B, 414C, 414D increases due to the etch loading effect during manufacture, e.g., plasma etching process for forming respective trenches for the portion 414A, 414B, 414C, 414D. In other words, shallower portions are provided with narrower portions, and deeper portions are provided with wider portions.

The example cross-section view illustrated in FIG. 4A also shows that pixel cells 404A, 404B, 404C of color pixel array 402A include another or a second DTI structure 436A that surrounds the respective pixel cell 404A, 404B, 404C regions of the semiconductor layer 422. As shown in the depicted example, the DTI structure 436B extends a DTI structure depth T2 from the backside 428 towards the front side 426 of the semiconductor layer 422 to isolate or separate each of the pixel cells 404A, 404B, 404C from neighboring pixel cells in the pixel array. One difference between color pixel array 402B of FIG. 4B and color pixel array 402A of FIG. 4A is that as illustrated in FIG. 4B, the DTI structure 436B is a partial DTI structure as the DTI structure depth T2 is greater than the depth D1 of the CDTI structures 414 and is less than the thickness between the backside 428 and the front side 426 of the semiconductor layer 422. In one example, an optional shallow trench structure 450 may also be included in color pixel array 402B. As shown in the example depicted in FIG. 4B, shallow trench structure 450 is disposed in semiconductor layer 422 proximate to the front side 426 between each pixel cell 404A, 404B, 404C and aligned with partial DTI structure 436B as shown to surround each pixel cell 404A, 404B, 404C.

The DTI structure 436B and optional shallow trench structure 450 may be formed of a low k material, an oxide material, or other suitable dielectric material in the semiconductor layer 422. The DTI structure 436B and/or the shallow trench structure 450 may be formed with the same or different material as the CDTI structures 414.

The example pixel array 402B shown in FIG. 4B also includes a buffer oxide layer 434 formed over the backside 428 of the semiconductor layer 422. In addition, a color filter array layer including a plurality of color filters 442 is formed over the buffer oxide layer 434. In one example, the color filers 442 may include a variety of different color filters including a combination of red, green, blue, clear/IR, etc. In one example, the plurality of color filters 442 may have an arrangement based on a Bayer pattern. A microlens layer including a plurality of microlenses 444 is formed over the color filters 442 of the color filter layer.

As shown in the depicted example, each microlens 444 and each color filter 442 is formed over and aligned with a respective CDTI structure 414 and photodiode 424 of the respective pixel cell 404A, 404B, 404C. As such, the optical path along which incident light 430 is directed passes through a respective microlens 444, color filter 442, oxide layer 434, backside 428, along and through CDTI structure 414, and through semiconductor layer 422 to photodiode 424 as shown.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, comprising:
a photodiode disposed in a pixel cell region of a semiconductor layer and proximate to a front side of the semiconductor layer to generate image charge in response to incident light directed through a backside of the semiconductor layer to the photodiode; and
a cell deep trench isolation (CDTI) structure disposed in the pixel cell region of the semiconductor layer along an optical path of the incident light to the photodiode and proximate to the backside of the semiconductor layer, wherein the CDTI structure comprises:
a plurality of portions arranged in the semiconductor layer,
wherein each of the plurality of portions extends a respective depth from the backside towards the front side of the semiconductor layer,
wherein the respective depth of each of the plurality of portions is different than a respective depth of a neighboring one of the plurality of portions, and
wherein said each of the plurality of portions is laterally separated and spaced apart from said neighboring one of the plurality of portions in the semiconductor layer.

2. The pixel cell of claim 1, wherein said neighboring one of the plurality of portions includes a nearest neighboring one of the plurality of portions.

3. The pixel cell of claim 1, wherein said each of the plurality of portions has a respective width, wherein the respective depth of said each of the plurality of portions increases as the respective width of said each of the plurality of portions increases.

4. The pixel cell of claim 1, wherein said each of the plurality of portions has a first end and a second end, wherein the first end of said each of the plurality of portions is at the backside of the semiconductor layer, wherein the second end of said each of the plurality of portions is opposite the first end and at the respective depth from the backside towards the front side in the semiconductor layer.

5. The pixel cell of claim 4, wherein the second ends of the plurality of portions define a surface having a cross-section that has a slope that is greater than zero with respect to the backside of the semiconductor layer, wherein the slope increases as a difference between respective depths of neighboring ones of the plurality of portions increases.

6. The pixel cell of claim 1, wherein the plurality of portions are arranged in a pattern of concentric shapes in the semiconductor layer.

7. The pixel cell of claim 6, wherein a center one of the plurality of portions has a respective depth that is a deepest of the plurality of portions.

8. The pixel cell of claim 6, wherein a center one of the plurality of portions has a respective depth that is a shallowest of the plurality of portions.

9. The pixel cell of claim 6, wherein the concentric shapes include concentric circular shapes in the semiconductor layer.

10. The pixel cell of claim 6, wherein the concentric shapes include concentric rectangular shapes in the semiconductor layer.

11. The pixel cell of claim 1, wherein the plurality of portions are arranged in a pattern of an array of pillar shapes in the semiconductor layer.

12. The pixel cell of claim 11, wherein a center one of the plurality of portions has a respective depth that is a deepest of the plurality of portions.

13. The pixel cell of claim 11, wherein a center one of the plurality of portions has a respective depth that is a shallowest of the plurality of portions.

14. The pixel cell of claim 1, further comprising a second deep trench isolation (DTI) structure surrounding the pixel cell region of the semiconductor layer to isolate the pixel cell from neighboring pixel cells, wherein the second DTI structure extends a second DTI structure depth from the backside towards the front side of the semiconductor layer.

15. The pixel cell of claim 14, wherein the second DTI structure depth is greater than a deepest depth of the CDTI structure and substantially equal to a thickness of the semiconductor layer between the backside and the front side of the semiconductor layer.

16. The pixel cell of claim 14, wherein the second DTI structure depth is greater than a deepest depth of the CDTI structure and less than a thickness of the semiconductor layer between the backside and the front side of the semiconductor layer.

17. The pixel cell of claim 16, further comprising a shallow trench structure disposed in the semiconductor layer proximate to the front side of the semiconductor layer and aligned with the second DTI structure to surround the pixel cell.

18. The pixel cell of claim 1, wherein the CDTI structure comprises dielectric material in the semiconductor layer.

19. The pixel cell of claim 1, wherein the CDTI structure has a symmetry with respect to a center one of the plurality of portions.

20. The pixel cell of claim 1, further comprising:
a buffer oxide layer formed over the backside of the semiconductor layer;
a color filter layer formed over the buffer oxide layer; and
a microlens layer formed over the color filter layer.

21. An imaging system, comprising:
a pixel array including an array of pixel cells formed in a semiconductor layer, wherein each of the pixel cells comprises:
a photodiode disposed in a pixel cell region of a semiconductor layer and proximate to a front side of the semiconductor layer to generate image charge in response to incident light directed through a backside of the semiconductor layer to the photodiode; and
a cell deep trench isolation (CDTI) structure disposed in the pixel cell region of the semiconductor layer along an optical path of the incident light to the photodiode and proximate to the backside of the semiconductor layer, wherein the CDTI structure comprises:
a plurality of portions arranged in the semiconductor layer,
wherein each of the plurality of portions extends a respective depth from the backside towards the front side of the semiconductor layer,
wherein the respective depth of each of the plurality of portions is different than a respective depth of a neighboring one of the plurality of portions, and
wherein said each of the plurality of portions is laterally separated and spaced apart from said neighboring one of the plurality of portions in the semiconductor layer;
control circuitry coupled to the pixel array to control operation of the pixel array; and
readout circuitry coupled to the pixel array to readout image data from the pixel array.

22. The imaging system of claim 21, further comprising function logic coupled to the readout circuitry to store the image data readout from the pixel array.

23. The imaging system of claim 21, wherein said neighboring one of the plurality of portions includes a nearest neighboring one of the plurality of portions.

24. The imaging system of claim 21, wherein said each of the plurality of portions has a respective width, wherein the respective depth of said each of the plurality of portions increases as the respective width of said each of the plurality of portions increases.

25. The imaging system of claim 21, wherein said each of the plurality of portions has a first end and a second end, wherein the first end of said each of the plurality of portions is at the backside of the semiconductor layer, wherein the second end of said each of the plurality of portions is opposite the first end and at the respective depth from the backside towards the front side in the semiconductor layer.

26. The imaging system of claim 25, wherein the second ends of the plurality of portions define a surface having a cross-section that has a slope that is greater than zero with respect to the backside of the semiconductor layer, wherein the slope increases as a difference between respective depths of neighboring ones of the plurality of portions increases.

27. The imaging system of claim 21, wherein the plurality of portions are arranged in a pattern of concentric shapes in the semiconductor layer.

28. The imaging system of claim 27, wherein a center one of the plurality of portions has a respective depth that is a deepest of the plurality portions.

29. The imaging system of claim 27, wherein a center one of the plurality of portions has a respective depth that is a shallowest of the plurality portions.

30. The imaging system of claim 27, wherein the concentric shapes include concentric circular shapes in the semiconductor layer.

31. The imaging system of claim 27, wherein the concentric shapes include concentric rectangular shapes in the semiconductor layer.

32. The imaging system of claim 21, wherein the plurality of portions are arranged in a pattern of an array of pillar shapes in the semiconductor layer.

33. The imaging system of claim 32, wherein a center one of the plurality of portions has a respective depth that is a deepest of the plurality of portions, and the plurality of portions are arranged symmetrically with respect to a center one of the plurality of portions.

34. The imaging system of claim 32, wherein a center one of the plurality of portions has a respective depth that is a shallowest of the plurality of portions, and the plurality of portions are arranged symmetrically with respect to a center one of the plurality of portions.

35. The imaging system of claim 21, further comprising a second deep trench isolation (DTI) structure surrounding the pixel cell region of the semiconductor layer to isolate the pixel cell from neighboring pixel cells, wherein the second DTI structure extends a second DTI structure depth from the backside towards the front side of the semiconductor layer.

36. The imaging system of claim 35, wherein the second DTI structure depth is greater than a deepest depth of the CDTI structure and substantially equal to a thickness of the semiconductor layer between the backside and the front side of the semiconductor layer.

37. The imaging system of claim 35, wherein the second DTI structure depth is greater than a deepest depth of the CDTI structure and less than a thickness of the semiconductor layer between the backside and the front side of the semiconductor layer.

38. The imaging system of claim 37, further comprising a shallow trench structure disposed in the semiconductor layer proximate to the front side of the semiconductor layer and aligned with the second DTI structure to surround the pixel cell.

39. The imaging system of claim 21, wherein the CDTI structure comprises dielectric material in the semiconductor layer.

40. The imaging system of claim 21, wherein some of the pixel cells are adapted to detect near infrared (NIR) light and some of the pixel cells are adapted to detect visible light, wherein an arrangement of the plurality of portions of the CDTI structure of said some of the pixel cells adapted to detect NIR light is different than an arrangement of the plurality of portions of the CDTI structure of said some of the pixel cells adapted to detect visible light.

41. The imaging system of claim 21, further comprising:
a buffer oxide layer formed over the backside of the semiconductor layer;
a color filter layer formed over the buffer oxide layer; and
a microlens layer formed over the color filter layer.

42. A method for providing a pixel cell, comprising:
providing a semiconductor layer including a photodiode disposed in a pixel cell region of the semiconductor layer and proximate to a front side of the semiconductor layer to generate image charge in response to incident light directed through a backside of the semiconductor layer to the photodiode;
depositing a patterned mask layer over the backside of the semiconductor layer, wherein the patterned mask layer includes a pattern having a plurality of openings having different widths, wherein each of the plurality of openings is laterally separated and spaced apart from a neighboring one of the plurality of openings in the pattern, wherein a respective width of each of the plurality of openings is different than a respective width of a neighboring one of the plurality of openings;
etching the backside of the semiconductor layer through the plurality of openings in the patterned mask layer to form a plurality of trenches in the semiconductor layer, wherein each one of the plurality of trenches has a respective depth that extends from the backside towards the front side of the semiconductor layer, wherein the respective depth of each of the plurality of trenches is different than a respective depth of a neighboring one of the plurality of trenches due to an etch loading effect;
removing the patterned mask layer; and
depositing a dielectric material into the plurality of trenches to form a cell deep trench isolation (CDTI) comprised of a plurality of portions in the pixel cell region of semiconductor layer along an optical path of the incident light to the photodiode and proximate to the backside of the semiconductor layer, wherein each of the plurality of portions of the CDTI structure comprises a respective one of the plurality of trenches filled with the dielectric material.

43. The method of claim 42, wherein a respective depth of said each of the plurality of portions increases as a respective width of said each of the plurality of portions increases due to a dry etch loading effect.

44. The method of claim 43, wherein said each of the plurality of portions has a first end and a second end, wherein the first end of said each of the plurality of portions is at the backside of the semiconductor layer, wherein the second end of said each of the plurality of portions is opposite the first end and at the respective depth from the backside towards the front side in the semiconductor layer.

45. The method of claim 44, wherein the second ends of the plurality of portions define a surface having a cross-section that has a slope that is greater than zero with respect to the backside of the semiconductor layer, wherein the slope increases as a difference between respective depths of neighboring ones of the plurality of portions increases.

46. The method of claim 42, wherein a center one of the plurality of portions has a respective depth that is a deepest of the plurality of portions, wherein depths of portions other than said center one of the plurality of portions are configured such that said portions other than the center one of the plurality of portions that surround said center one of the plurality of portions are symmetrically arranged with respect to said center one of the plurality of portions.

47. The method of claim 42, wherein a center one of the plurality of portions has a respective depth that is a shallowest of the plurality of portions, wherein depths of portions other than said center one of the plurality of portions are configured such that said portions other than the center one of the plurality of portions that surround said center one of the plurality of portions are symmetrically arranged with respect to said center one of the plurality of portions.

48. The method of claim 42, further comprising forming a second deep trench isolation (DTI) structure surrounding the pixel cell region of the semiconductor layer to isolate the pixel cell from neighboring pixel cells, wherein the second DTI structure extends a second DTI structure depth from the backside towards the front side of the semiconductor layer.

49. The method of claim 42, further comprising:
forming a buffer oxide layer over the backside of the semiconductor layer;
forming a color filter layer formed over the buffer oxide layer; and
forming a microlens layer over the color filter layer.

* * * * *